(12) United States Patent
Chang et al.

(10) Patent No.: US 10,859,646 B2
(45) Date of Patent: Dec. 8, 2020

(54) METHOD AND SYSTEMS FOR COIL SELECTION IN MAGNETIC RESONANCE IMAGING TO REDUCE ANNEFACT ARTIFACT

(71) Applicant: General Electric Company, Schenectady, NY (US)

(72) Inventors: Shaorong Chang, Hartland, WI (US); Zachary Slavens, New Berlin, WI (US); Dawei Gui, Sussex, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 243 days.

(21) Appl. No.: 15/995,059

(22) Filed: May 31, 2018

(65) Prior Publication Data
US 2019/0369181 A1 Dec. 5, 2019

(51) Int. Cl.
*G01R 33/36* (2006.01)
*G01R 33/44* (2006.01)
(Continued)

(52) U.S. Cl.
CPC ..... *G01R 33/3664* (2013.01); *G01R 33/0023* (2013.01); *G01R 33/443* (2013.01); *G01R 33/58* (2013.01); *G01R 33/0005* (2013.01)

(58) Field of Classification Search
CPC ............ G01R 33/3664; G01R 33/0023; G01R 33/58; G01R 33/443
See application file for complete search history.

(56) References Cited

U.S. PATENT DOCUMENTS 6,717,406 B2 * 4/2004 Sodickson ......... G01R 33/3415
324/307
6,961,455 B2 11/2005 Ma et al.
(Continued)

FOREIGN PATENT DOCUMENTS

EP 2255214 B1 5/2017
WO 2009112987 A1 9/2009
(Continued)

OTHER PUBLICATIONS

Chang, S. et al., "Methods and Systems for Coil Selection in Magnetic Resonance Imaging," U.S. Appl. No. 15/995,012, filed May 31, 2018, 50 pages.
(Continued)

*Primary Examiner* — Reena Aurora
(74) *Attorney, Agent, or Firm* — McCoy Russell LLP

(57) ABSTRACT

Various methods and systems are provided for selecting radio frequency coil array comprising a plurality of coil elements for magnetic resonance imaging. In one embodiment, the method includes grouping the plurality of coil elements into receive elements groups (REGs) according to REGs information; generating REG sensitivity maps; determining, for each REG, signal in a region of interest (ROI) and signal in an annefact source region based on the REG sensitivity maps; selecting one or more REGs based on the signal in the ROI and the signal in the annefact source region; and scanning the ROI with the coil elements in the one or more selected REGs being activated and the coil elements not in any selected REGs being deactivated. In this way, annefact artifacts in the reconstructed image may be reduced.

20 Claims, 14 Drawing Sheets

(51) Int. Cl.
*G01R 33/00* (2006.01)
*G01R 33/58* (2006.01)

(56) References Cited

U.S. PATENT DOCUMENTS

| | | | |
|---|---|---|---|
| 7,800,368 B2 | 9/2010 | Vaughan et al. | |
| 7,924,007 B2 | 4/2011 | Arnold et al. | |
| 8,188,738 B2 | 5/2012 | Hori et al. | |
| 8,488,860 B2 | 7/2013 | Uchizono et al. | |
| 8,502,535 B2 | 8/2013 | Jurrissen et al. | |
| 8,934,694 B2 | 1/2015 | Chen et al. | |
| 9,084,553 B2 | 7/2015 | Warmuth | |
| 9,395,431 B2 | 7/2016 | Detsky et al. | |
| 9,427,171 B2 | 8/2016 | Gdaniec et al. | |
| 9,655,522 B2 | 5/2017 | Li et al. | |
| 9,675,249 B2 | 6/2017 | Miyazaki et al. | |
| 9,678,189 B2 | 6/2017 | Mekkaoui | |
| 9,700,220 B2 | 7/2017 | Miyazaki et al. | |
| 9,760,979 B2 | 9/2017 | Chen et al. | |
| 9,835,705 B2 | 12/2017 | Weingartner et al. | |
| 9,846,215 B2 | 12/2017 | Hamada et al. | |
| 9,846,217 B2 | 12/2017 | Lin | |
| 9,874,620 B2 | 1/2018 | Ahmad et al. | |
| 9,886,745 B2 | 2/2018 | Chen et al. | |
| 2003/0132750 A1 | 7/2003 | Machida et al. | |
| 2005/0275402 A1 | 12/2005 | Campagna | |
| 2006/0087320 A1 | 4/2006 | Machida et al. | |
| 2006/0197633 A1 | 9/2006 | Lee | |
| 2007/0013375 A1 | 1/2007 | Akao et al. | |
| 2007/0164742 A1 | 7/2007 | Bito et al. | |
| 2007/0210793 A1 | 9/2007 | Kiefer | |
| 2008/0129298 A1 | 6/2008 | Vaughan et al. | |
| 2008/0211502 A1 | 9/2008 | Arnold et al. | |
| 2008/0290870 A1* | 11/2008 | Misic | G01R 33/3415 324/318 |
| 2011/0006766 A1 | 1/2011 | Jurrissen et al. | |
| 2011/0103668 A1 | 5/2011 | Uchizono et al. | |
| 2014/0002083 A1 | 1/2014 | Asaba et al. | |
| 2014/0145717 A1 | 5/2014 | Ozawa et al. | |
| 2014/0300355 A1* | 10/2014 | Fautz | G01R 33/28 324/309 |
| 2015/0247911 A1 | 9/2015 | Iwadate | |
| 2015/0355303 A1 | 12/2015 | Kuhara | |
| 2016/0018489 A1 | 1/2016 | Farivar-Mohseni | |
| 2016/0198970 A1 | 7/2016 | Liu et al. | |
| 2016/0324427 A1 | 11/2016 | Meyer et al. | |
| 2017/0049355 A1 | 2/2017 | Furudate | |
| 2017/0089993 A1 | 3/2017 | McKinnon et al. | |
| 2017/0273578 A1 | 9/2017 | Finn et al. | |
| 2017/0328970 A1 | 11/2017 | Bi et al. | |
| 2017/0350953 A1 | 12/2017 | Huang et al. | |
| 2018/0059195 A1 | 3/2018 | Lai et al. | |
| 2019/0369180 A1 | 12/2019 | Chang et al. | |
| 2019/0369181 A1 | 12/2019 | Chang et al. | |
| 2019/0369198 A1 | 12/2019 | Chang | |

FOREIGN PATENT DOCUMENTS

| | | |
|---|---|---|
| WO | 2009112987 A8 | 9/2009 |
| WO | 2014084259 A1 | 6/2014 |

OTHER PUBLICATIONS

Chang, S. et al., "Method and Systems for Coil Selection in Magnetic Resonance Imaging," U.S. Appl. No. 15/995,051, filed May 31, 2018, 67 pages.

Chang, S., "Method and Systems for Coil Selection in Magnetic Resonance Imaging to Reduce Phase Wrap Artifact," U.S. Appl. No. 15/995,023, filed May 31, 2018, 50 pages.

United States Patent and Trademark Office, Office Action Issued in U.S. Appl. No. 15/995,012, dated Apr. 8, 2020, 18 pages.

United States Patent and Trademark Office, Office Action Issued in U.S. Appl. No. 15/995,023, dated Apr. 8, 2020, 17 pages.

* cited by examiner

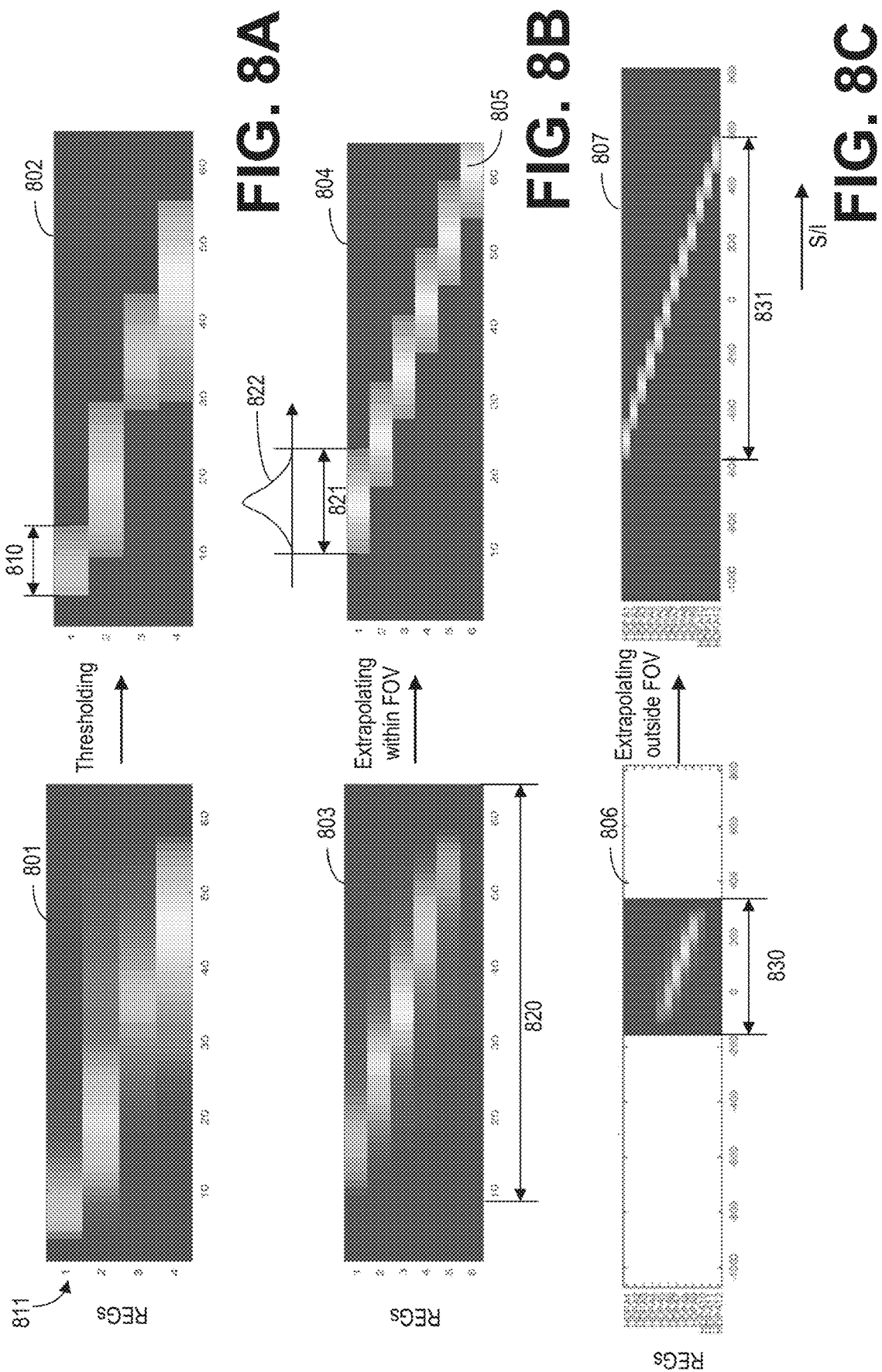

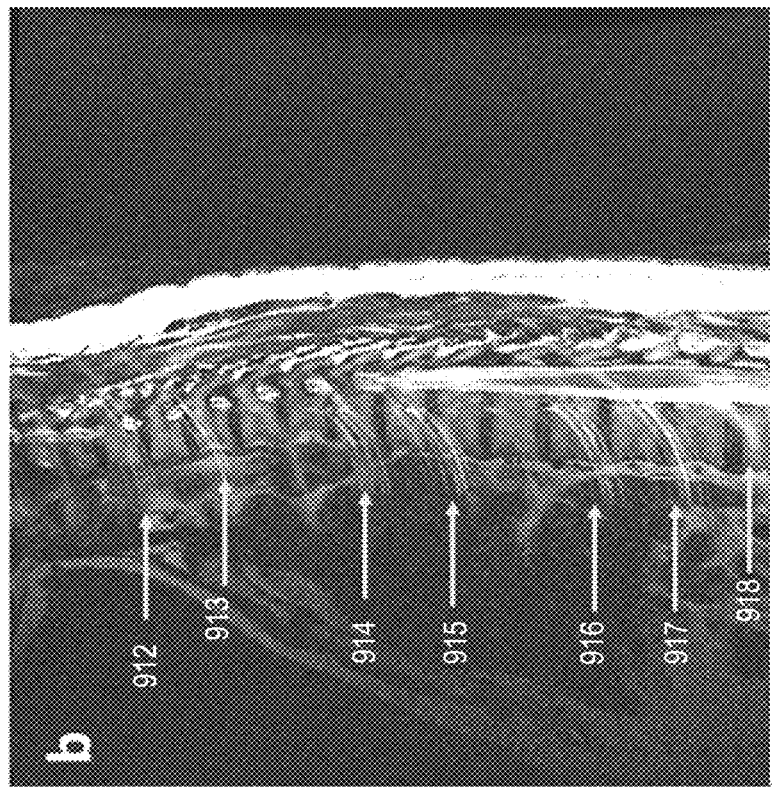
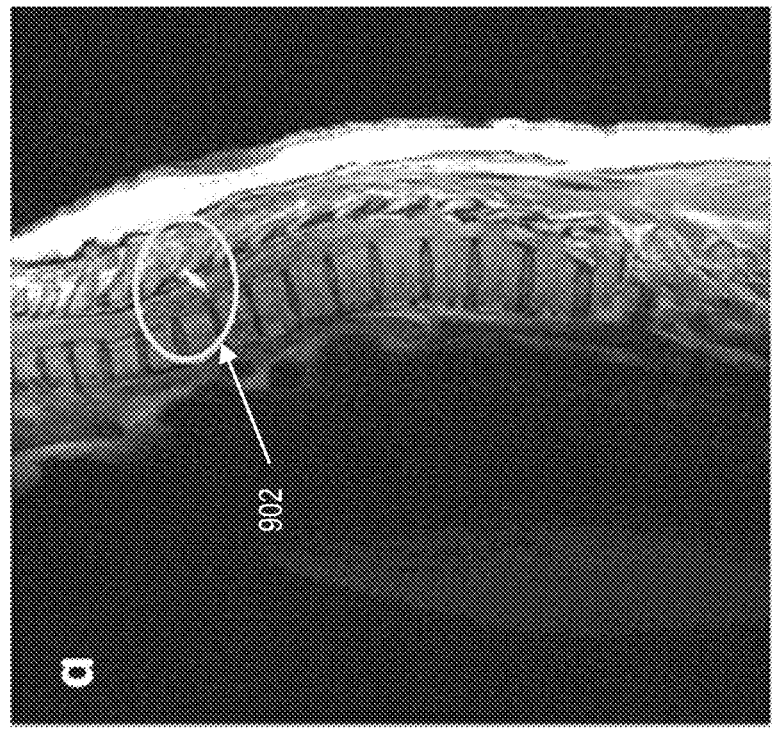
FIG. 9B
FIG. 9A

METHOD AND SYSTEMS FOR COIL SELECTION IN MAGNETIC RESONANCE IMAGING TO REDUCE ANNEFACT ARTIFACT

FIELD

Embodiments of the subject matter disclosed herein relate to magnetic resonance imaging, and more particularly, to selecting radio-frequency (RF) coil arrays to reduce the annefact artifact during magnetic resonance imaging.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field $B_0$. When the human body, or part of the human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil arrays and is transformed into the image using a computer and known reconstruction algorithms.

In some examples, one or more of the RF coil arrays may be removable. For example, based on a given imaging objective, the operator can position a selected surface RF coil array over the imaging subject and plug the RF coil array into the MRI imaging apparatus. Further, some RF coil arrays may be deformable, stretchable, or otherwise may have varying shapes or positions relative to the imaging subject. Under certain conditions, the RF coil arrays may receive MR signals from regions where the gradient fields are nonlinear, for example, at the edge of the gradient coils. MR signals generated at the regions with nonlinear gradient fields (also called annefact source regions) may introduce annefact artifacts to the reconstructed image covering a region of interest.

BRIEF DESCRIPTION

In one embodiment, a method for magnetic resonance imaging (MRI) with a receive radio frequency (RF) coil array including a plurality of coil elements includes grouping the plurality of coil elements into receive elements groups (REGs) according to REGs information, generating REG sensitivity maps, determining, for each REG, signal in a region of interest (ROI) and signal in an annefact source region based on the REG sensitivity maps, selecting one or more REGs based on the signal in the ROI and the signal in the annefact source region, and scanning the ROI with the coil elements in the selected REGs being activated and the coil elements not in any selected REGs being deactivated. In this way, intensity of signals generated from outside of the field of view may decrease, and artifacts in the reconstructed image may be reduced or removed.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 8A-8C are images showing implementation of the subroutine of FIG. 7 for generating the REG sensitivity maps.

FIG. 9A shows an example of a star artifact and FIG. 9B shows an annefact artifact in MRI images.

DETAILED DESCRIPTION

Figure 1:
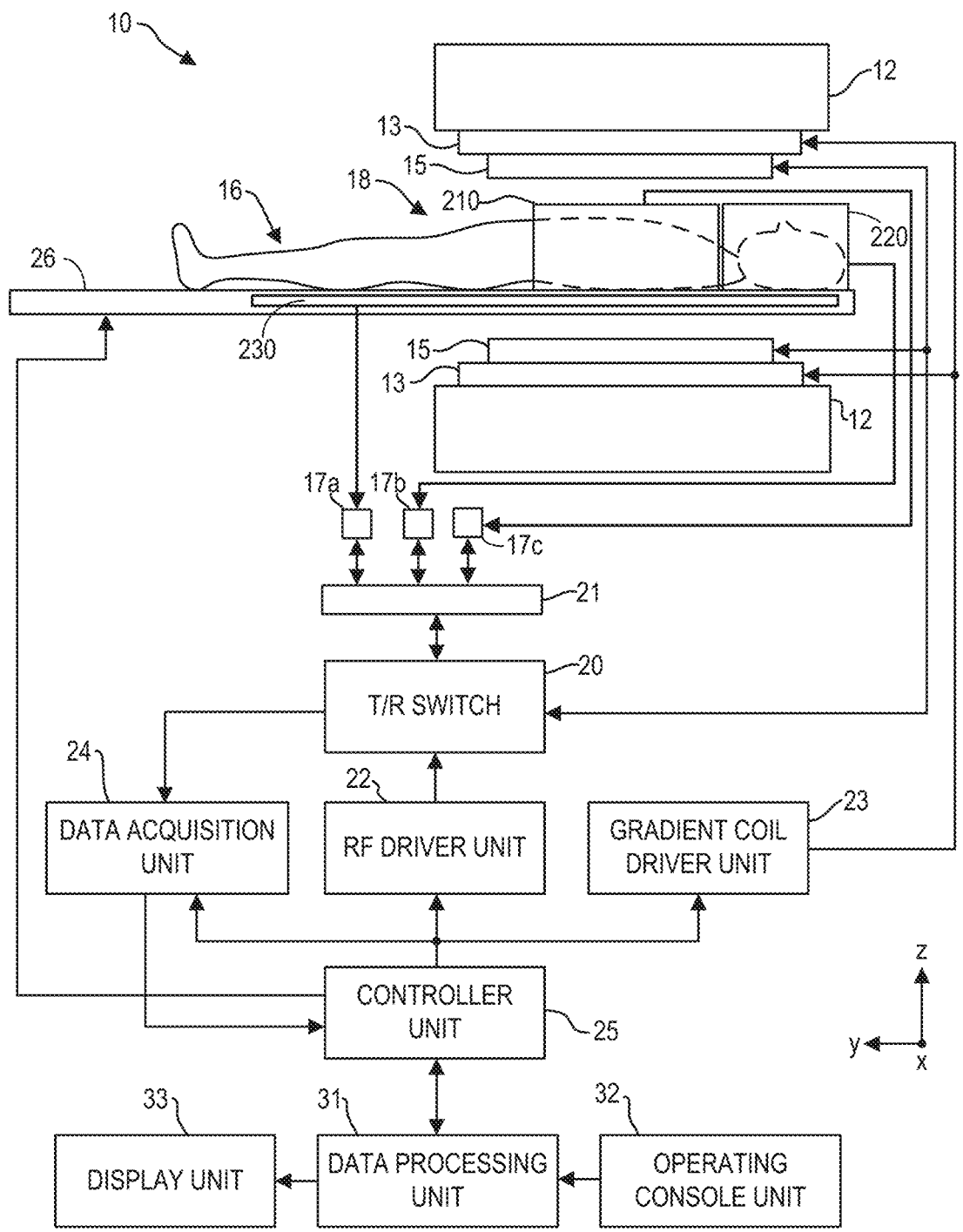
FIG. 1 is a block diagram of an MRI system according to an embodiment.
Figure 2:
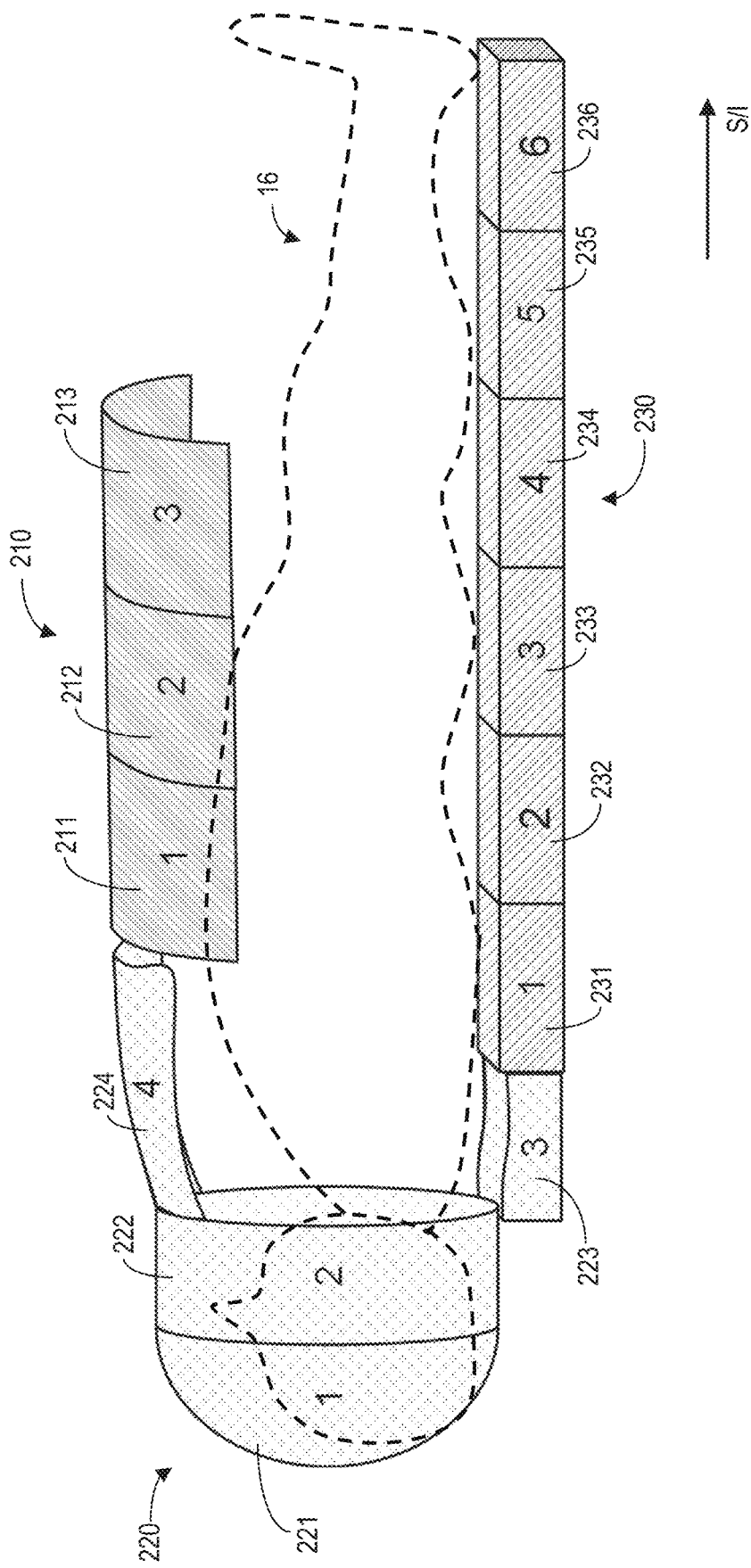
FIG. 2 is an example arrangement of RF coil arrays relative to an imaging subject.

The following description relates to various embodiments of selecting coil elements of one or more radio frequency (RF) coil arrays for receiving magnetic resonance (MR) signals in a magnetic resonance imaging (MRI) system, such as the MRI system depicted in FIG. 1. As shown in FIG. 2, a plurality of RF coil arrays may be arranged around a patient's body. Each of the RF coil arrays may include one or more coil elements. Each coil element is electronically coupled to the MRI apparatus, and may individually receive MR signals generated from different spatial locations. The coil elements may be grouped into a plurality of receive element groups (REGs) based on predetermined coil element grouping information.

During MRI imaging, various gradient magnetic fields are applied to an imaging space encompassing a field of view (FOV). The applied gradient fields may become nonlinear at, for example, the edge of the gradient coils. As such, MR signals may be received not only from regions with linear gradient fields, but also from regions with nonlinear gradient fields. Thus, with the assumption that the received MR signals are all generated from regions with linear gradient fields, artifacts such as star artifact or annefact artifact as shown in FIGS. 9A and 9B may be introduced to the reconstructed image. The annefact artifact may be reduced by deactivating coil elements that receive signals from the annefact source regions. However, if the number of the coil elements is reduced significantly for receiving the MR signals, the signal to noise ratio (SNR) of the reconstructed image may reduce as well. As such, there is a tradeoff between the strength of the annefact artifact and the image SNR.

According to embodiments disclosed herein, one or more of the REGs may be selected to strike a balance between annefact artifacts and SNR based on, for example, annefact source region properties and sensitivity of REGs. For example, the annefact source region properties may include an annefact intensity curve and an annefact sensitivity factor. The annefact intensity curve reflects the location and the strength of the nonlinearity of the gradient fields. The annefact sensitivity factor represents the severity of impact of the annefact source regions, if any, on the reconstructed images. The annefact sensitivity factor depends on the imaging protocol used for scanning. For example, for a given annefact source region, if a first imaging protocol is used, the impact of the annefact may be high; while if a second imaging protocol is used, the impact of the annefact may be low. The annefact sensitivity factor and annefact curve are considered in conjunction to evaluate the contribution to the annefact artifacts in the reconstructed image. The REG may be selected by evaluating its contribution to MR signals generated within the ROI as compared to its contribution to the annefact artifact originated from the annefact source region(s). For example, the REGs close to the edge of the gradient coils may be sensitive to both MR signals generated from regions of linear gradient fields and regions of nonlinear gradient fields (i.e., the annefact source regions). If the sensitivity of the REG to the MR signals generated from the annefact source regions is high, the REG may not be selected and may thus be turned off during a main scan. Otherwise, if the sensitivity of the REG to the MR signals generated from the annefact source regions is low, the REG may be set in the receiving mode to receive MR signals during the main scan. As such, REGs with high sensitivity to the annefact artifact or star artifact source region may be excluded from receiving the MR signals. In this way, the annefact or star artifact may be reduced or eliminated from the reconstructed MRI image.

Figure 3:
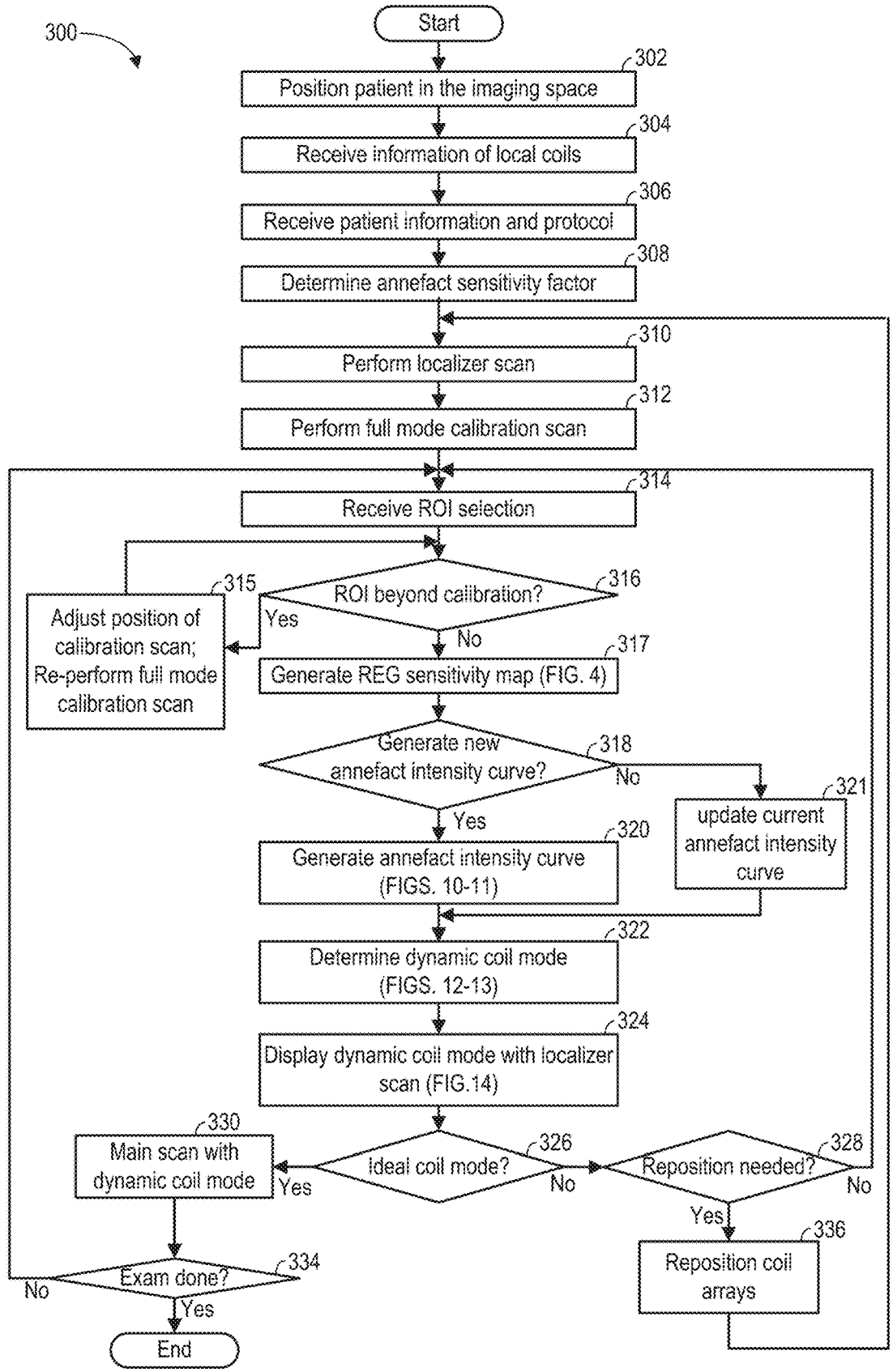
FIG. 3 is a high-level flow chart illustrating an example method for selecting RF coil arrays during an MRI scan.
Figure 10:
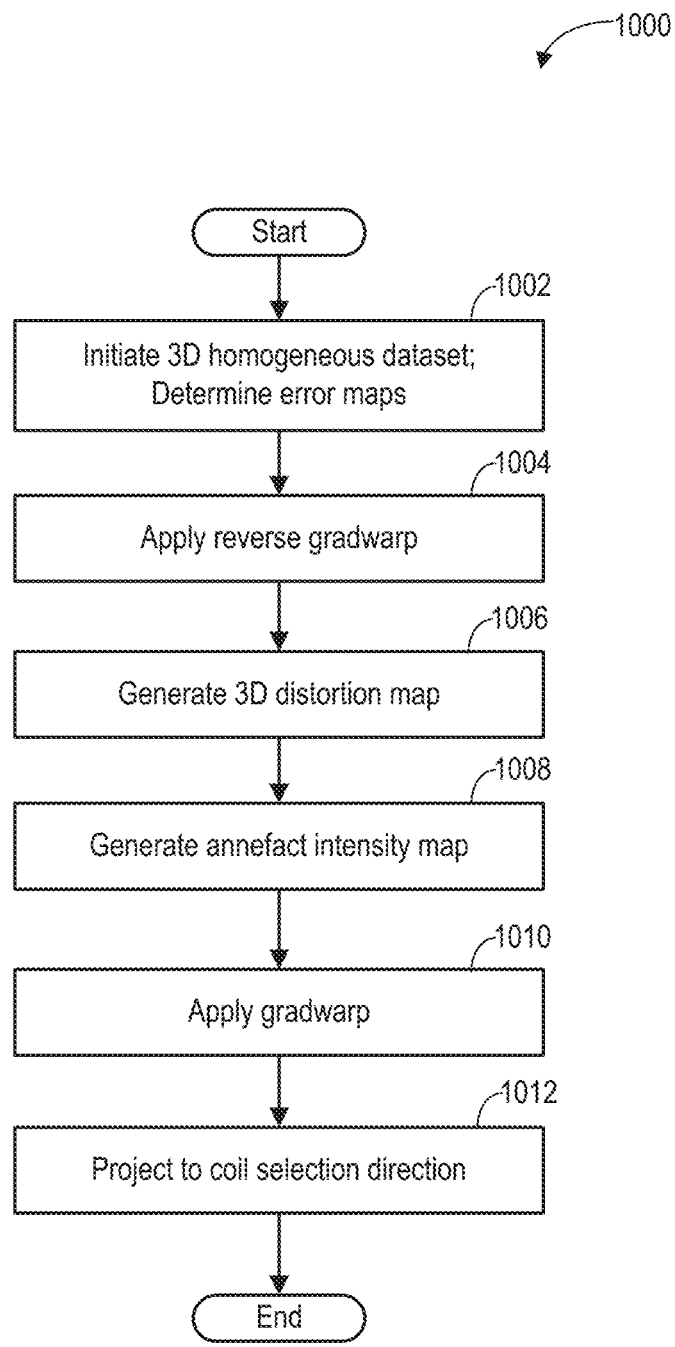
FIG. 10 is a flow chart illustrating an example subroutine for determining an annefact intensity curve.
Figure 12:
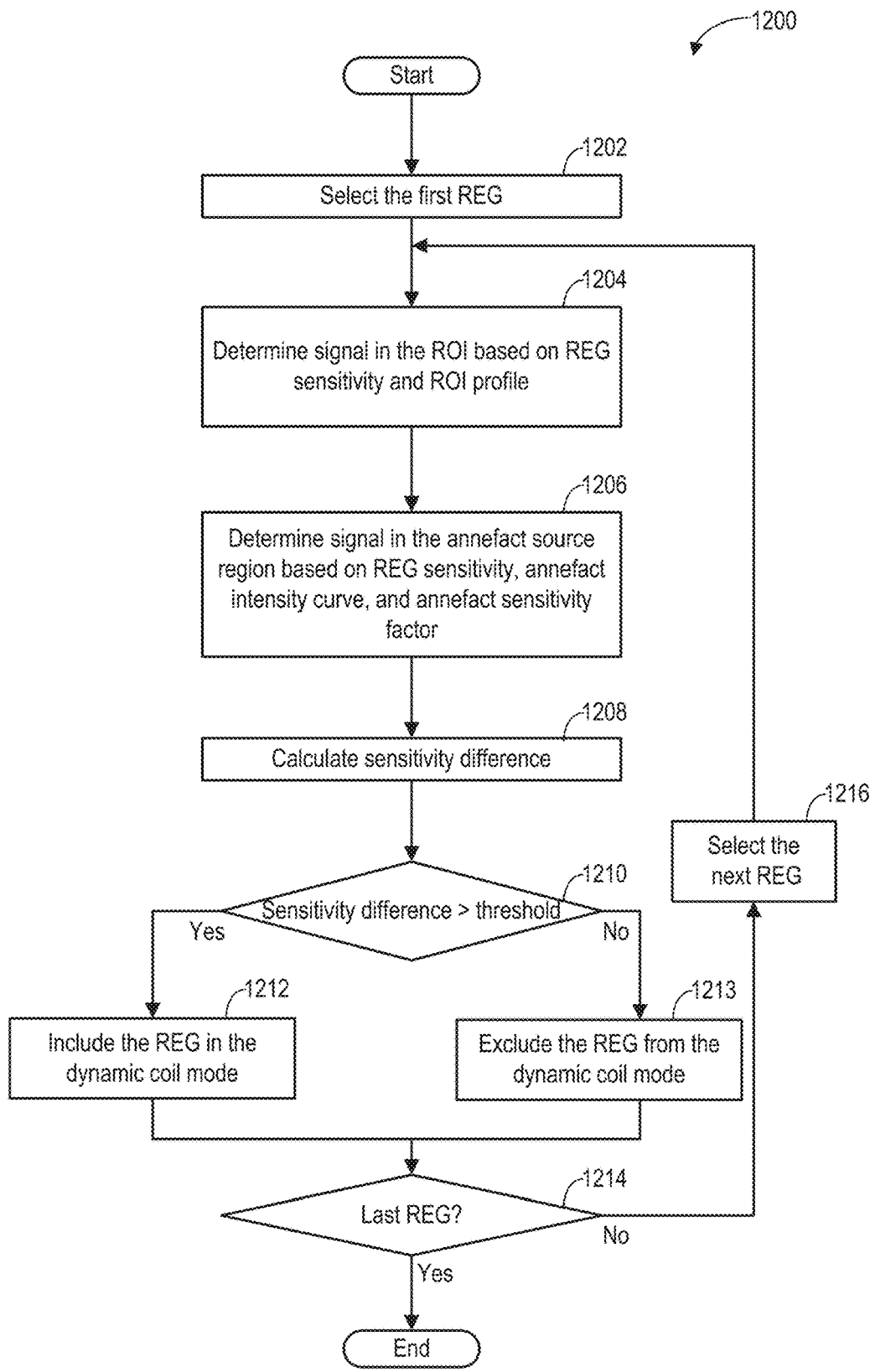
FIG. 12 is flow chart of an example subroutine for determining a dynamic coil mode.
Figure 13:
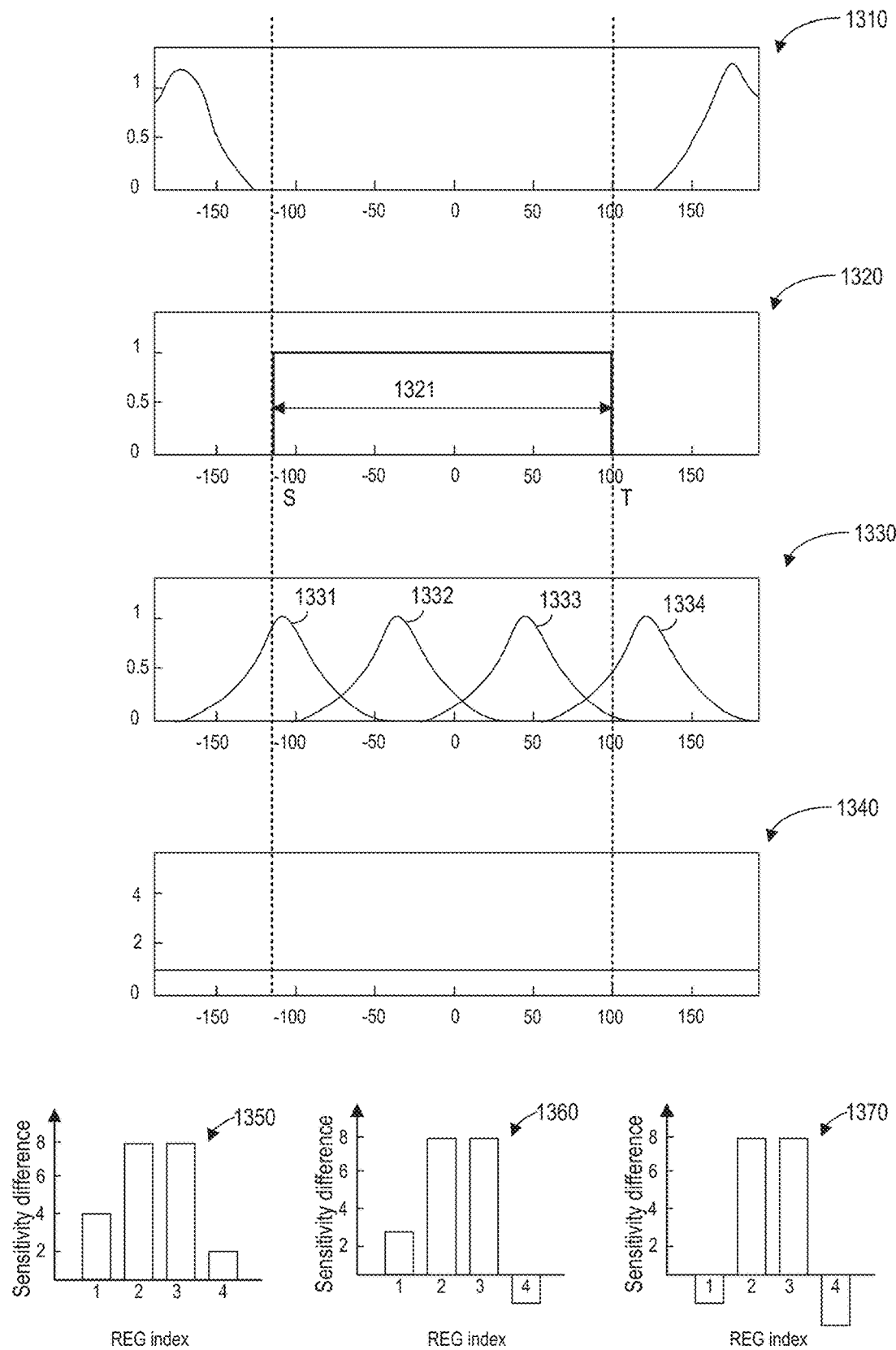
FIG. 13 is a set of images illustrating implementation of the subroutine of FIG. 12 for determining the dynamic coil mode.
Figure 14:
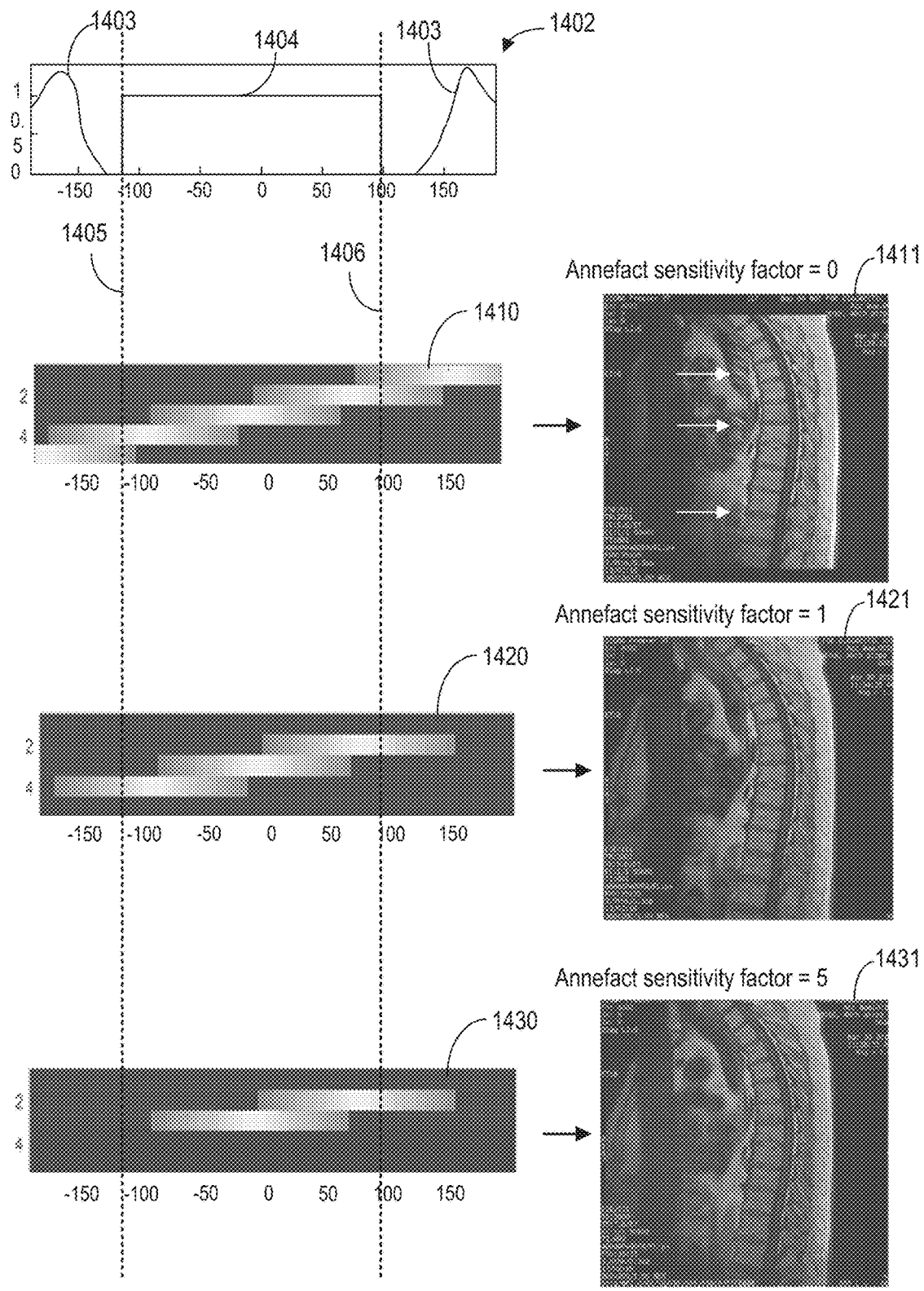
FIG. 14 shows examples images based on different annefact sensitivity factors.
Figure 15:
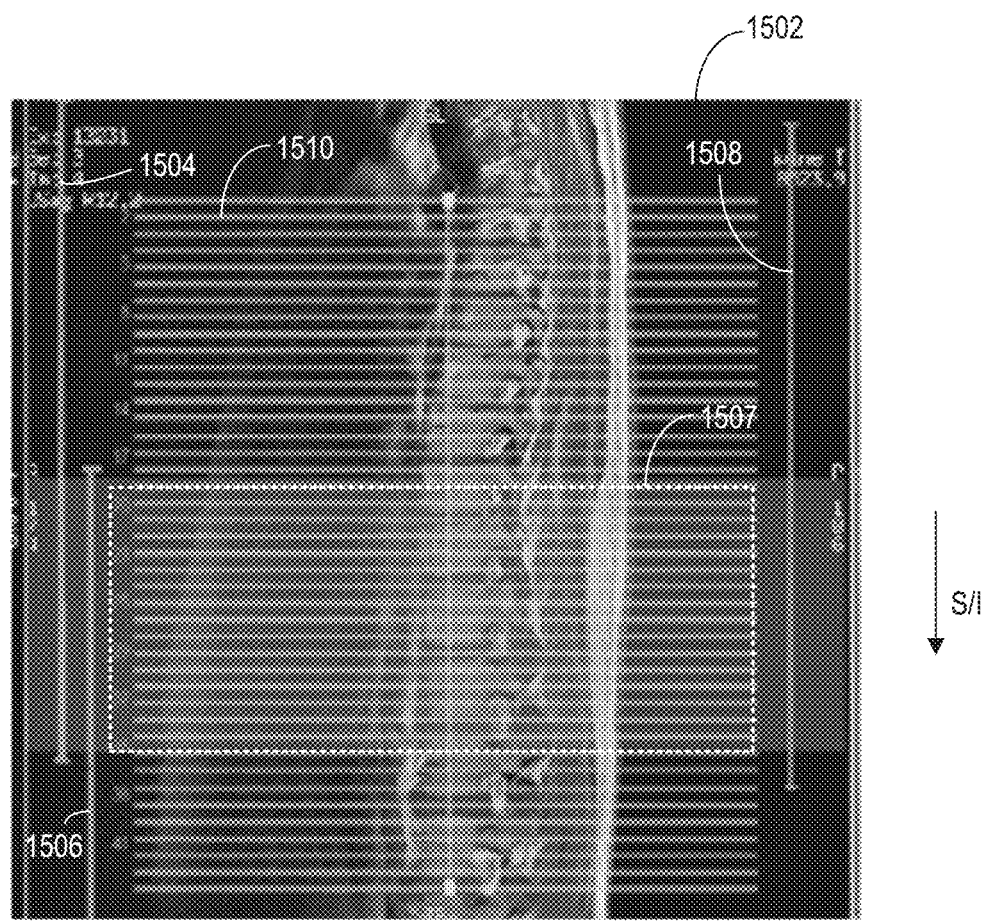
FIG. 15 is an example visual representation of the dynamic coil mode with an MRI image.

As shown in FIG. 3, during the MRI scan, MR signals received from selected REGs are reconstructed to form an image of the imaging subject. The REGs are selected based on data acquired from a lower resolution calibration scan. Based on the acquired data, REG sensitivity maps may be determined according to subroutine of FIG. 4. During the subroutine of FIG. 4, a coil element sensitivity of each coil element may be generated from a 3D dataset acquired via the coil element. Raw REG sensitivity maps are generated by combining the coil element sensitivities of the coil elements belonging to each of the REGs. FIG. 5 shows example raw REG sensitivity maps. Based on the type of the coil array, REG sensitivity maps may be generated from the raw REG sensitivity maps according to the subroutine of FIG. 7. FIGS. 8A-8C show examples for processing raw REG sensitivity maps to obtain REG sensitivity maps. FIGS. 9A and 9B show MRI images with star artifact and annefact artifact. FIG. 10 shows an example subroutine for generating an annefact intensity curve based on data acquired during the calibration scan. The dynamic coil mode may then be determined by selecting one or more REGs based on each REG's sensitivity differences as shown in FIGS. 12-13. With different annefact sensitivity factor values, the dynamic coil mode may include different numbers of REGs, as shown in FIG. 14. The dynamic coil mode may be displayed to the operator as shown in FIG. 15.

FIG. 1 illustrates a magnetic resonance imaging (MRI) apparatus 10 that includes a magnetostatic field magnet unit 12, a gradient coil unit 13, one or more local RF coil arrays (210, 220, and 230), an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of the slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

Three local RF coil arrays 210, 220, and 230 are shown herein. The local RF coil arrays are disposed, for example, to enclose the region to be imaged of the subject 16. In the static magnetic field space or imaging space 18 where a static magnetic field $B_0$ is formed by the magnetostatic field magnet unit 12, the local RF coil arrays may transmit, based on a control signal from the controller unit 25, an RF pulse that is an electromagnet wave to the subject 16 and thereby generates a high-frequency magnetic field $B_1$. This excites a spin of protons in the slice to be imaged of the subject 16.

The local RF coil arrays receive, as a MR signal, the electromagnetic wave generated when the proton spin returns into alignment with the initial magnetization vector. In one embodiment, the local RF coil may transmit and receive an RF pulse using the same local RF coil. In another embodiment, the local RF coil may be used for only receiving the MR signals, but not transmitting the RF pulse. Details of the local RF coil arrays are presented in FIG. 2.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the local RF coil arrays (such as local RF coil arrays 210 and 220), which may be easily disconnected from the MR apparatus 10 and replaced with another local RF coil, the RF body coil unit 15 is fixedly attached and connected to the MRI apparatus 10. Furthermore, whereas coil arrays can transmit to or receive signals from only a localized region of the subject 16, the RF body coil unit 15 generally has a larger coverage area and can be used to transmit or receive signals to the whole body of the subject 16. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect one or more of the local RF coil arrays to the data acquisition unit 24 when the local RF coil arrays operate in receive mode, and to the RF driver unit 22 when operating in transmit mode. When the local RF coil arrays and the RF body coil unit 15 are both used in a single scan, for example if the local RF coil arrays are configured to receive MR signals and the RF body coil unit 15 is configured to transmit RF signals, then the T/R switch 20 may direct control signals from the RF driver unit 22 to the RF body coil unit 15 while directing received MR signals from the local RF coil arrays to the data acquisition unit 24. The RF body coil unit 15 may be configured to operate in a transmit-only mode, a receive-only mode, or a transmit-receive mode. The local RF coil arrays may be configured to operate in a transmit-receive mode or a receive-only mode.

The RF driver unit 22 includes a gate modulator (not shown), an RF power amplifier (not shown), and an RF oscillator (not shown) that are used to drive the RF coil arrays and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil arrays.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the local RF coil arrays. In the data acquisition unit 24, the phase detector phase detects, using the output from the RF oscillator of the RF driver unit 22 as a reference signal, the MR signals received from the RF coil arrays and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25. One or more of the RF coil arrays may be coupled to the table 26 and moved together with the table.

The controller unit 25 includes a computer and a recording medium on which a program to be executed by the computer is recorded, in some embodiments. The program when executed by the computer causes various parts of the apparatus to carry out operations corresponding to predetermined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil arrays may be utilized for different scanning objectives. To that end, one or more the RF coil arrays, such as RF coil array 210, may be disconnected from the MRI apparatus 10, so that a different coil array may be connected to the MRI apparatus 10. The RF coil arrays may be coupled to the T/R switch 20, and thus to the RF driver unit 22 and the data acquisition unit 24, via a connector and an RF port interface 21. Each RF coil array may be electrically coupled to one or more connectors (such as connector 17a-17c). The connector(s) may be plugged into the RF port interface 21 to electronically couple the RF coil array to the T/R switch 20. For example, coil array 210 may be electronically coupled to the MRI apparatus 10 by plugging connector 17c into RF port interface 21. As such, the local RF coil arrays may be easily changed.

FIG. 2 shows an example arrangement of RF coil arrays of the MRI apparatus 10 of FIG. 1 relative to the subject 16. In particular, an anterior coil array 210, a head-neck coil array 220, and a posterior coil array 230 are positioned on top of the body, over the head-neck, and under the body, respectively. Each coil array is an individual piece and may be physically separated from each other. One or more of the coil arrays (such as the anterior coil array 210 and head-neck coil array 220) may be connected or removed from the MRI apparatus 10 by the operator. The posterior coil array 230 may be embedded within and moved together with table 26. Each coil array may include one or more coil elements, and each coil element receives MR signals generated from a specific volume of the subject 16. The coil elements may or may not overlap with each other. For example, the anterior coil array 210 includes three rows of coil elements (211-213) arranged along the superior to inferior (S/I) direction. Each row (211, 212, 213) may include multiple (e.g., 4, 5, 6, 7, 8, etc.) coil elements along the direction perpendicular to the S/I direction. The head coil array 220 includes four rows of coil elements (221-224) to cover different surface area of the subject; and the posterior coil array 230 includes six rows of coil elements (231-236) arranged along the S/I direction. In some embodiments, the relative position among the coil elements of a coil array may be fixed with respect to each other. In some embodiments, the relative position among the coil elements of a coil array may be variable relative to each other.

The coil elements of one coil array or coil elements from multiple coil arrays may be grouped into receive element groups (REGs) according to REGs information. The REGs information is predetermined rules for grouping coil elements of the coil array for transmitting and/or receiving MR signals. Different REGs include different combinations of coil elements. A coil element may be included in more than one REG. The REGs information may be determined based on the imaging objective, geometry of the coil array, hardware limitation (e.g., multiple coil elements must be turned on/off at the same time), and so on. The REGs information may further provide exclusive REGs. For example, when one coil element is included in two REGs, the two REGs are exclusive of each other, meaning that they cannot be selected at the same time.

Take anterior coil array 210 as an example. All coil elements in the anterior coil array 210 may be grouped as a first REG. Coil elements in row 211 may be grouped as a second REG; coil elements in row 212 may be grouped as a third REG; and coil elements in row 213 can be grouped as a fourth REG. Coil elements in a column (along the direction perpendicular to the rows) may be grouped as a fifth REG. The first REG and the second REG are exclusive of each other because they both include coil elements in row 211. The second REG and the fifth REG are exclusive of each other because they both include a coil element at the cross of row 212 and the column, and so on. REGs of the posterior coil array 230 may be defined similarly. As another example, coil elements in rows 223 and 224 of the head-neck coil array 220 may be grouped as one neck-piece REG. In some embodiments, each coil element may represent a separate REG. The REGs information may be saved in the memory of the MRI apparatus 10.

Each coil element of the coil arrays is electronically coupled to the controller unit (such as controller unit 25 of FIG. 1) via a channel. In particular, each coil element can sense the MR signals and transfer the MR signal to the data acquisition unit (such as data acquisition unit 24 of FIG. 1) of the MRI apparatus via the corresponding channel. The data acquisition unit then outputs digitized MR signals to the controller unit. As such, the channels of the coil arrays may also be grouped according to the REGs information. In some examples, each individual coil element may be coupled to one channel, and each channel may only be coupled to one coil element (e.g., anterior coil array 210 may include 12 coil elements coupled to the data acquisition unit via 12 separate channels). In other examples, more than coil element may be coupled to a given channel (e.g., anterior coil array 210 may include 12 coil elements coupled to the data acquisition unit via 6 separate channels).

During an MRI scan, one or more REGs of one coil array or a plurality of coil arrays may be selected to image an operator defined ROI. The one or more REGs are selected along a coil selection direction. In one example, the coil selection direction may be a direction along which coil elements have different coverages. In other words, the extent of one or more coil elements covers different regions along the coil selection direction. For example, if an RF coil array comprises a four by four array of coil elements, the RF coil array may be arranged into four REGs, each REG comprising a row of coil elements extending along a first direction (e.g., horizontally). The coil selection direction may be along a second direction perpendicular to the first direction (e.g., vertical), as the coil elements of each REG has different coverage along the second direction. In another example, if the RF coil array is arranged into four REGs with each REG comprising a column extending along the second direction, the coil selection direction may be along the first direction. In one example, the RF coil array may include REGs that have different coverages in more than one direction. The coil selection direction may be one of the multiple directions, determined based on the imaging protocol. In another example, the coil selection direction may be the same as the slice selection direction during the MRI scan. In other words, the coil selection direction is perpendicular to the plane containing the imaging slice. The coil selection direction may also be the same as the scan direction.

FIG. 3 shows an example method 300 for performing an exam of the imaging subject using the MRI apparatus (such as the MRI apparatus 10 of FIG. 1). The MRI image is reconstructed from data acquired based on a dynamic coil mode during a higher resolution main scan. The dynamic mode defines the REGs that are selected for imaging the ROI. The REGs are selected based on each REG's sensitivity to MR signals generated within and outside of the ROI. In particular, during the calibration scan, each coil element of each REG that overlaps with the FOV may be set to receive the MR signals. Based on signals received from each coil element, a coil element sensitivity of the respective coil element is determined. The MR signals from all of the receiving coil elements may be combined and used for determining an annefact intensity curve. The annefact intensity curve represents the intensity or strength of the annefact artifact along the REG selection direction. The sensitivity of each REG to MR signals generated outside and within the ROI may then be determined based on the coil element sensitivity and the annefact intensity curve. Method 300 also includes displaying a visual representation of the selected REG, to help the operator verify or adjust the coil array position and/or the ROI before the main scan. When a plurality of RF coil arrays are plugged into the MRI apparatus, each RF coil array may be considered individually. That is, a dynamic coil mode may be determined for each coil array. Alternatively, the RF coil arrays may be considered collectively, and a dynamic coil mode may be determined for all of the coil arrays. Method 300 may be executed by controller unit 25 of FIG. 1 according to instructions stored in non-transitory memory.

At 302, responsive to the operator's instruction, the table (such as table 26 of FIG. 1) is moved to position the subject (such as a patient) in the imaging space (such as imaging space 18 of FIG. 1).

At 304, information of the coil arrays that are arranged around the patient is received at the controller unit, so that the type of the coil arrays may be identified. The information of the coil arrays may be received via the operator input. Alternatively, the MRI apparatus may automatically identify the coil array type, for example, by identifying the connector (such as connectors 17a-17c of FIG. 1) of the coil array that has been plugged into the apparatus. Method 300 may load the REGs information related to the coil arrays that are connected to the MRI apparatus. The connected coil arrays may also be displayed to the operator via the display unit.

At 306, operator input is received at the controller unit regarding the patient information and the imaging protocol. In particular, the operator may select the protocol based on the anatomy that is going to be scanned. By selecting a protocol, a field of view (FOV) may be determined correspondingly. The FOV defines a three-dimensional volume of the patient. In one example, the FOV defines the volume that is going to be scanned for the localizer scan and the calibration scan. In some examples, the FOV may include an entirety of the imaging subject/MRI bore volume that the MRI system is capable of imaging without moving the table on which the imaging subject is placed.

At 308, the value of the annefact sensitivity factor is determined based on the imaging protocol received at 306. The annefact sensitivity factor represents the severity of the impact of the annefact artifact, or the amplitude of the annefact artifact in the reconstructed MRI image. In one example, the annefact sensitivity factor are integers from zero to five, wherein an annefact sensitivity factor of zero represents no annefact artifact, and the annefact sensitivity factor of five represents the strongest annefact artifact. The annefact sensitivity factor may depend on the scan plane, read out direction (frequency encoding direction) of MR signals, pulse sequence of the main scan, reconstruction method, and so on. For example, if the read out direction aligns with the coil selection direction or S/I direction, the annefact sensitivity factor may be set at a low value. As another example, for the same sagittal spine scan, if the squared root of sum square (SOS) reconstruction method is used to combine the channels, the annefact sensitivity factor may be set to 5; while if the eC3 reconstruction method is used, the annefact sensitivity factor may be decreased to, for example, 1 or 2. Generally, fast spine error (FSE) is more sensitive to annefact than gradient echo (GRE) plus sequence, thus the annefact sensitivity factor may be set at a higher value for FSE than GRE.

At 310, a localizer scan is performed via the controller unit (e.g., the controller unit may send commands to the components of the MRI system to execute the localizer scan). The localizer scan may be a lower resolution scan of the FOV. Herein, the lower resolution scan is a scan with large voxel volume, which can be completed with reduced measurement time. In one example, the image data acquired during the localizer scan may be used to reconstruct an MR image of the FOV. The localizer scan may generate one or more 2D images of the subject, for example, in the sagittal, coronal, and/or the transverse planes.

At 312, a full mode low resolution calibration scan is performed in the calibration FOV via the controller unit (e.g., the controller unit may send commands to the components of the MRI system to execute the calibration scan). The calibration FOV may be either the same as or different than the localizer FOV. During the full mode calibration scan, each coil element of one or more of the coil arrays receives MR signals. One 3D dataset is generated from MR signals received from each channel corresponding to the coil element. As such, each 3D dataset corresponds to one channel of the plurality of channels, and to one coil element to which the channel is electronically coupled. In some embodiments, MR signals from all channels of all coil arrays are collected. In some embodiments, MR signals from channels of selected coil arrays are collected. The coil arrays may be selected based on the relative position of the coil array from the imaging area or the FOV. For example, coil arrays that are within a threshold distance from the scan center are set in the receiving mode during the calibration scan, while the non-selected coil arrays do not receive the MR signals. The threshold distance may be a distance within which the coil array is sensitive to the MR signals along the REG selection direction. In yet another embodiment, each coil element of selected REGs receives the MR signals, while the non-selected REGs do not receive the MR signals. The coil arrays may be selected based on the relative position of the REG from the imaging area or the FOV. For example, coil arrays that are within a threshold distance from the FOV and/or scan center are selected. The threshold distance may be a distance within which the REG is sensitive to the MR signals along the REG selection direction. The relative position of the coil array and the REG relative to the FOV and/or scan center may be estimated based on prior knowledge such as the type of the coil array. In one embodiment, the localizer scan and the calibration scan may be combined, wherein a low resolution 3D scan of the FOV may generate both the localizer scan image and the calibration data.

At 314, a ROI selected by the operator is received at the controller unit. For example, images generated by the localizer scan may be displayed on the display unit, and the operator may select the ROI for the main scan based on the images. The ROI may be smaller than the localizer FOV, at least in some examples. In some embodiments, the ROI may be defined by selection of the position of the corners of a 3D volume. In some embodiments, the ROI may be defined by the center position and ranges in each of the superior-inferior, medial-lateral, and posterior-anterior directions. In yet other embodiments, the ROI may be in the shape of a cube, which is defined by the center position and a range, and a rotational angle. For example, for cardiac scan, the ROI may be defined by the center position of the heart and a predetermined range.

At 316, method 300 includes determining via the controller unit whether the received ROI is beyond the volume (such as calibration FOV) scanned during the full mode calibration scan at 312. In one embodiment, determining if the ROI is beyond the calibration at 316 may include displaying the spatial location of the ROI and the spatial location of the volume scanned in the calibration scan. If the ROI is within the volume scanned in the calibration scan, method 300 proceeds to 318. Otherwise, if the ROI is not within the volume scanned in the calibration scan, method 300 proceeds to 315 to adjust the position of the scanned volume of the calibration scan. The adjustment may include adjusting the center position of the volume scanned during the calibration scan. Then, the full mode calibration scan is performed again over the adjusted scanned volume.

At 317, one or more REG sensitivity maps are generated via the controller unit based on data acquired during the full mode calibration scan. In particular, a plurality of 3D datasets are obtained from the calibration scan. Each 3D dataset is acquired from a particular coil element (or a particular channel). The coil element sensitivity of the particular coil element may then be determined by projecting the corresponding 3D dataset along a coil selection direction. As such, each coil element corresponds to one coil element sensitivity. The coil element sensitivities of the plurality of coil elements are combined to generate REG sensitivities according to predetermined REGs information. The REG sensitivity map may be constructed based on the generated REG sensitivities. Details regarding generating the REG sensitivity maps are presented in FIG. 4.

At 318, method 300 includes determining whether or not to generate a new annefact intensity curve. For example, the new annefact intensity curve may be generated if no annefact intensity curve is stored in the MRI apparatus. In another example, the new annefact intensity curve may be generated responsive to a change in table position. In another example, if the imaging protocol is not changed during the exam, the current annefact intensity curve stored in the memory may be used at 321. In yet another example, 318 may be skipped and a new annefact intensity curve is generated at 312 after each calibration scan, or alternatively, after each ROI selection when the annefact sensitivity factor is greater than 0, to align the annefact curve center with the scan center.

If a new annefact intensity curve is to be generated, method 300 proceeds to 320, and an annefact intensity curve is generated based on data acquired during the full mode calibration scan. In particular, a 3D dataset acquired from all of the receiving coil elements during the calibration scan at 312 is determined. After removing the received MR signals generated from regions with linear gradient fields, the acquired dataset is projected into a 1D annefact intensity curve along the coil selection direction. The value of the annefact intensity curve reflects the strength of the nonlinearity of the gradient fields at a respective point along the coil selection direction. Method 300 may store the generated annefact intensity curve in the memory of the MRI apparatus. Details regarding generating the annefact intensity curve are presented below with respect to FIGS. 10-11.

If a new annefact intensity curve is not to be generated, method 300 proceeds to 321, and the current annefact intensity curve is updated. For example, the annefact intensity curve may be updated based on the ROI received at 314. The center of the annefact intensity curve may be shifted to the center of received ROI.

At 322, a dynamic coil mode is generated via the controller unit based on the annefact sensitivity factor determined at 308, the REG sensitivity map(s) generated at 317, and the annefact intensity curve generated at 320 or updated at 321. The dynamic coil mode determines the REGs to be used for imaging the ROI during the main scan. A subroutine for generating the dynamic coil mode is described in more detail below with respect to FIGS. 12-13.

At 324, a visual representation of the dynamic coil mode is displayed together with images acquired via the localizer scan at 308 via the display unit. An example visual representation is shown in FIG. 15. In particular, an image of the imaging subject acquired during the localizer scan may be displayed along with the slice position and the extent of sensitivity of the selected REG(s). Further, an overlapped area between REGs may also be displayed. In this disclosure, the extent of a REG is used interchangeable with the extent of sensitivity of a REG.

At 326, method 300 includes receiving an input from the operator at the controller unit indicating whether the current dynamic coil mode is ideal e.g., based on the display at 324. In one example, the operator may determine whether the extent of the REGs of the dynamic coil mode matches the ROI. If the ROI does not match the selected REGs, the operator may adjust the position of the coil array. In another example, the operator may determine whether the overlap between the REGs is too large. Responsive to the overlap being greater than a threshold overlap, the operator may readjust the position of one or more of the coil arrays. If the controller receives the confirmation for the dynamic coil mode, method 300 proceeds to 330 and executes the main scan, which is described in more detail below. Otherwise, if the operator determines that the dynamic coil mode is not ideal, method 300 may move to 328.

At 328, the operator determines whether or not repositioning of the coil array is needed. If the operator determines to reposition the coil array, at 336, the position of one or more of the coil arrays relative to the subject may be adjusted (e.g., the operator may adjust a position of a surface anterior coil array, which may be movable), or a position of the imaging subject relative to the MRI bore and/or RF coil arrays may be adjusted. Responsive to repositioning the coil arrays, method 300 performs a new localizer scan. If the operator determines not to reposition the coil arrays, for example, if the RF coil array(s) that are to be used in the main scan are not to be repositioned, method 300 loops back to 314 and receives a new ROI selection. The new ROI may be smaller than the previous ROI, which may facilitate full coverage of the ROI by one or more REGs.

At 330, the main scan is executed over the ROI using the dynamic coil mode via the controller unit (e.g., the controller unit may send commands to the components of the MRI system to execute the main scan). In particular, during the main scan, MR signals are received from coil elements in the REGs selected according to the dynamic coil mode, but not from any coil elements that are not in the selected REGs. In other words, the coil elements not in the selected REGs are turned off during the main scan. The main scan is a higher resolution 3D scan to generate high quality images of the ROI. The main scan has a lower voxel volume than the localizer scan at 308 and the calibration scan at 312. Executing the main scan at 330 may further include reconstructing and displaying one or more MRI images based on the received MR signals.

At 334, method 300 determines whether the current exam session is completed. The exam session may be ended via the operator input. Alternatively, method 300 may determine whether the exam session is ended based on the imaging protocol selected at 306. If the session is not ended, method 300 moves to 314 to receive a new ROI selection.

Figure 4:
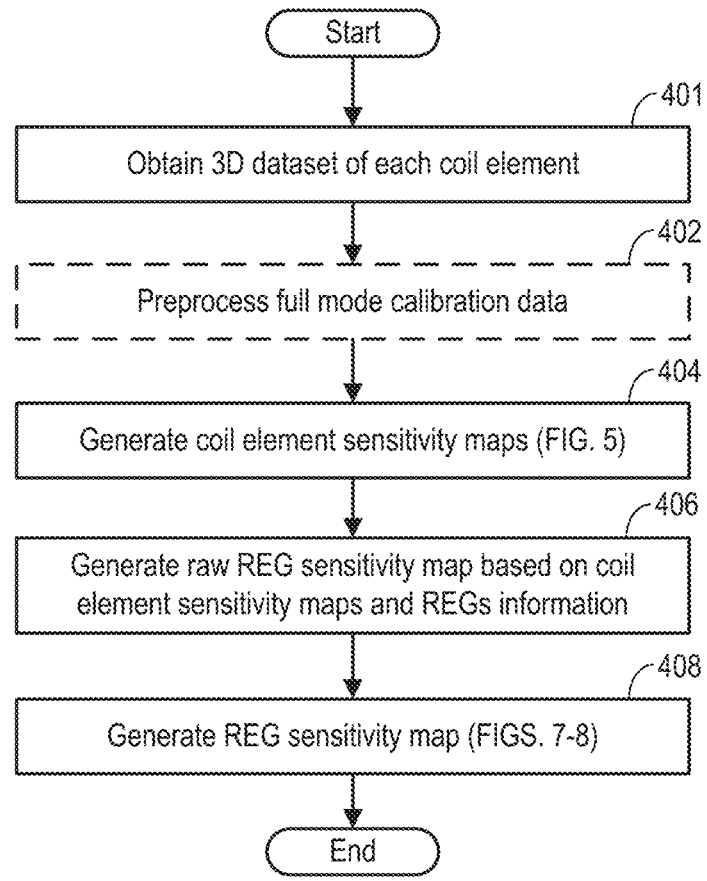
FIG. 4 is a flow chart illustrating an example subroutine for determining receive element group (REG) sensitivity maps.
Figure 5:
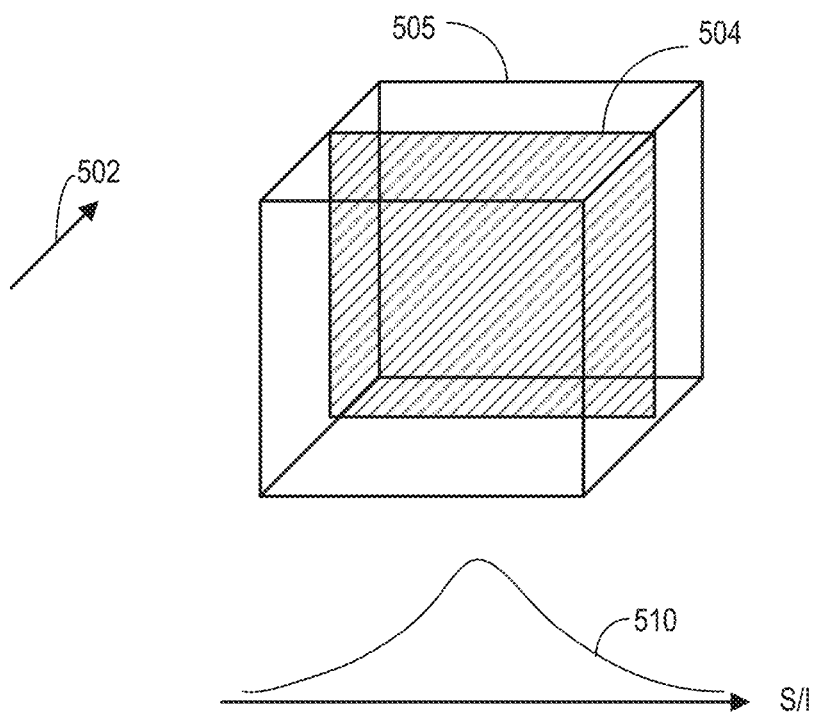
FIG. 5 is an image illustrating projection of a calibration dataset to one direction to generate a coil element sensitivity.

FIG. 4 shows example subroutine 400 for determining the REG sensitivity maps. The REG sensitivity maps include a REG sensitivity of one or more REGs. In particular, raw REG sensitivity maps are first generated based on the coil element sensitivity of each coil element or each corresponding channel. The raw REG sensitivity maps may then be extrapolated to REGs within or outside of the FOV based on the configuration of the coil array.

At 401, after performing the full mode calibration scan at 312 of FIG. 3, a 3D dataset is obtained from each coil element that is set to the receiving mode during the full mode calibration scan. Each 3D dataset is received from each channel coupled to the coil element. For example, if N coil elements are set to the receiving mode during the full mode calibration scan, N 3D datasets are acquired, each dataset corresponding to one coil element. The 3D dataset may be in image space. That is, the value of each data point in the 3D dataset corresponds to the strength of the MR signal received from the respective coil element. The spatial location of the data point is the location of the MR signal source.

At 402, subroutine 400 optionally includes processing the plurality of obtained 3D datasets. In particular, error corrections may be performed on each 3D dataset of each coil element. For example, one or more error maps, such as the frequency map, the phase map, and slice gradwarp error map may be applied to the dataset to correct spatial distortions. Through the preprocessing, errors in spatial location of each data point of the digitized MR signals may be corrected.

At 404, one 1D coil element sensitivity for each coil element (or for each channel) is generated based on the acquired datasets. For example, if N coil elements are set to the receiving mode during the full mode calibration scan, N 3D datasets are acquired, and N coil element sensitivities are determined. Specifically, each 3D dataset acquired during the calibration scan may be projected to the coil selection direction. In one example, the coil selection direction may be the S/I direction.

FIG. 5 illustrates an example coil element sensitivity 510 obtained by projecting a 3D dataset 505 onto the S/I direction. The 3D dataset 505 may first be projected onto the sagittal plane 504 along the medial-lateral (R/L) direction 502. For example, to project the 3D dataset to a 2D plane, data points along the medial-lateral direction 502 are summed to obtain a data point in the sagittal plane 504. Then, the projected 2D data may be projected again onto the S/I direction to obtain the coil element sensitivity 510.

At 406, raw REG sensitivity maps are generated based on the coil element sensitivities from 404 and the REGs information. In one example, for each REG, the coil sensitivities of the coil elements included in the REG are combined, such as by summing, to generate a raw REG sensitivity map.

Figure 6:
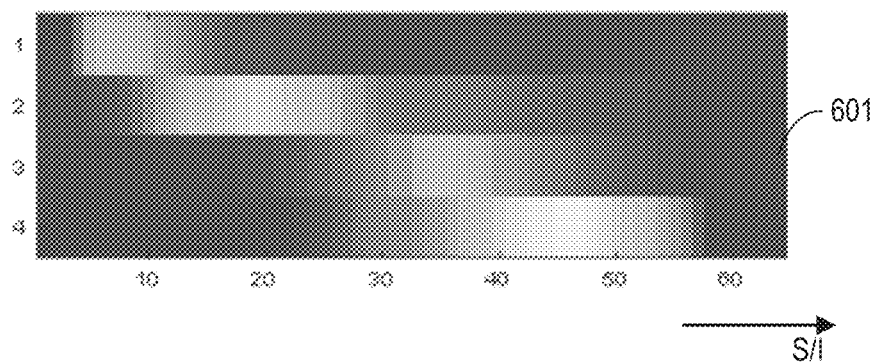
FIG. 6 shows an example of raw REG sensitivity maps.

FIG. 6 shows example raw REG sensitivity maps 601. The y axis is an index of the REGs (e.g., each REG is represented individually on the y axis). Each row corresponds to the REG sensitivity of the respective REG. Four REGs are included. The x axis indicates distance (such as in pixels or cm) along the S/I direction. The raw REG sensitivity values are color coded in grayscale. Each REG is sensitive to MR signals generated from different ranges along the S/I direction.

Figure 7:
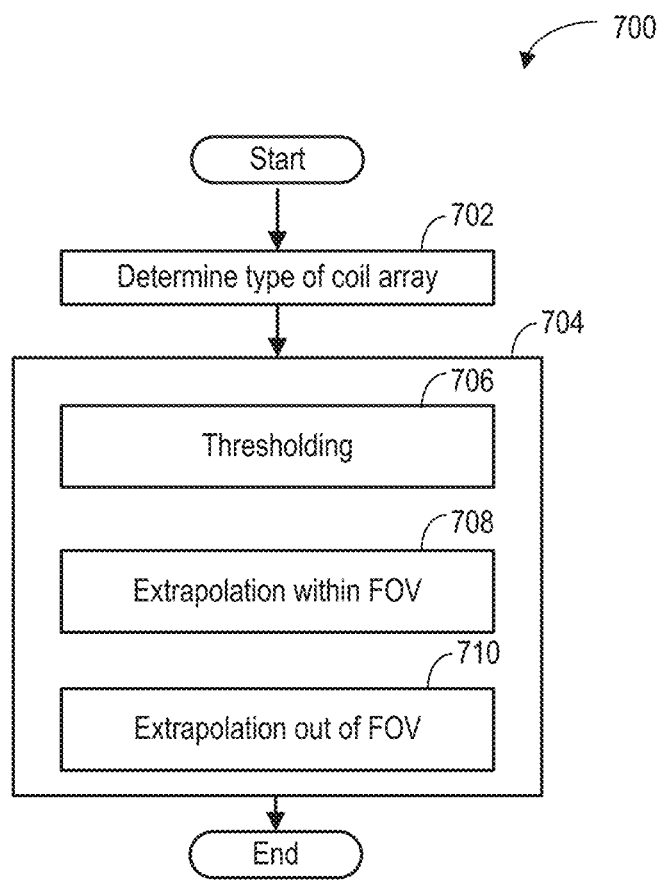
FIG. 7 is a flow chart illustrating an example subroutine for generating the REG sensitivity maps based on the raw REG sensitivity maps.

FIG. 7 shows subroutine 700 for generating REG sensitivity maps based on the raw REG sensitivity maps, such as the raw REG sensitivity maps 601 of FIG. 6. The raw REG sensitivity maps may be processed based on the type of the coil array. FIGS. 8A-8C show examples of REG sensitivity maps generated based on the raw REG sensitivity maps via subroutine 700.

At 702, the type of the coil array represented in the raw REG sensitivity map is determined. For example, the subroutine may determine if the RF coil array is a fixed-to-table coil (e.g., posterior coil), floating coil (e.g., anterior coil), rigid coil (e.g., head and neck coil), flexible coil (e.g., air coil), or other type of RF coil array. In other examples, the subroutine may determine the length of the RF coil array (e.g., relative to the FOV) and/or number of REGs in the RF coil array.

At 704, the sensitivity of each REG in the raw REG sensitivity map may be processed based on the type of coil array. In one example, at 706, the raw REG sensitivity map is thresholded with a threshold sensitivity level. The threshold sensitivity level may be determined based on the noise level of the MR signals. Any data point of the REG sensitivity map having a value lower than the threshold sensitivity level is set to a fixed low level (such as zero). Example raw REG sensitivity maps 801 are shown in FIG. 8A for an RF coil array having four REGs, such as the head-neck coil array. Similar to the raw REG sensitivity maps 601 of FIG. 6, each row of the raw REG sensitivity maps 801 represents the combined sensitivity of one REG along the coil selection direction. After thresholding, low level data points are discarded by setting those data points (e.g., pixels) to a zero value. The extent for each REG can be determined as the extent of non-zero sensitivity of the REG. For example, the extent of the first REG 811 is 810.

In another example, additionally or alternatively, the processing may include replacing the thresholded sensitivity of each REG with a Gaussian fitting of the same extent. The Gaussian fitting replacement may be applied to REGs of an anterior coil array or a posterior coil array, for example. In one example, as shown in FIG. 8B, the thresholded sensitivity of the first REG of raw REGs sensitivity map 803 is replaced with Gaussian fitting 822. The Gaussian fitting 822 is shown in grayscale of REG sensitivity map 804. For each row of the raw REG sensitivity map, the thresholded sensitivity values are replaced with a Gaussian curve of the same extent along the coil selection direction (such as the S/I direction). In one example, the Gaussian curve is determined by fitting the thresholded sensitivity of the REG. In another embodiment, the Gaussian curve has a maximum value and variance determined by the original signal (e.g., the maximum value is the same as or similar to the maximum value of the original signal).

In an example, at 708, the REG sensitivity maps may be extrapolated within the FOV. In one example, the REG sensitivity maps may be extrapolated to the REGs not receiving MR signals during the calibration scan. In another example, the REG sensitivity maps may be extrapolated to the REGs that receives low amplitude MR signals during the calibration scan. The REG sensitivity maps may be extrapolated based on the information of the REGs of the coil array. For example, the sensitivity of a first REG included in the REG sensitivity maps may be extrapolated to a second REG if the second REG has the same configuration as the first REG. The configuration may include the number and type of coil elements, relative position of the coil elements, and the rigidity of the coil array.

FIG. 8B shows an example of extrapolated REG sensitivity maps 804 of an anterior coil array based on the raw REG sensitivity maps 803. In the raw REG sensitivity maps 803, the sixth REG has low values. As such, all values of the sixth REG in the REG sensitivity map 803 are set to zero during thresholding process of 702. As the sixth REG is of the same type of the fifth REG, and the relative position of the sixth REG and the fifth REG is assumed to be the same as the relative position of the fifth REG and the fourth REG, the sensitivity of the sixth REG may be determined based on the sensitivity of the fifth REG. In one example, sensitivity of the sixth REG 805 is added to the REG sensitivity maps

804 by shifting the sensitivity of the fifth REG based on the relative position between the fifth and sixth REGs. In another example, sensitivity for the sixth REG may be a Gaussian curve with an extent the same as the extent of the fifth REG. As such, without an additional calibration scan, the extrapolated REG sensitivity maps 804 may be generated to cover the full FOV 820 along the S/I direction.

In yet another example, at 710, the REG sensitivity maps may be extrapolated outside of the FOV. The extrapolation may be based on similarity of the REGs, the coil array rigidity, and type and position of the coil elements. Extrapolation outside of the FOV may be applied to posterior coil arrays or other arrays with coil elements that lie outside the FOV and/or that are not prone to movement or positioning variability. As the calibration scan may not be able to cover the full extent of the coil array along the coil selection direction, by extrapolating the REG sensitivity map outside of the FOV, REG sensitivity maps for the entire coil array may be obtained based on one calibration scan of the imaging area.

FIG. 8C shows an example of an extrapolated REG sensitivity maps 807 of a posterior coil array based on the raw REG sensitivity maps 806. The raw REG sensitivity maps 806 may be generated by executing a calibration scan within FOV 830 and projecting the data along the S/I direction. As the REGs outside of the FOV 830 are similar to the REGs within the FOV (similar in that the REGs may have the same number of coil elements, be spaced apart by an equal manner, etc.), the REG sensitivity maps after thresholding 702 and Gaussian fitting replacement 708 may be extrapolated to cover the entire extent 831 of the coil array. In one example, as the relative positions among the coil elements of the posterior array are fixed, the REG sensitivity maps may be extrapolated outside of the FOV 830 by shifting the REG sensitivity maps within FOV 830 based on prior knowledge of relative positions between the REGs in the posterior coil array.

FIG. 9A shows an MRI image 901 of a spine, and FIG. 9B shows another MIll image 910 of a spine. Image 901 includes a star artifact 902, which may be characterized by localized high-intensity pixels. The start artifact may be caused by exited signals that are improperly spatially encoded and as a result "piles up." Image 910 includes annefact artifacts indicated by arrows 912-918, which may be characterized by streaks across the imaging FOV. The annefact artifact may originate in high signal intensity regions caused by the collapse of gradient coil field outside of the FOV. Sagittal spine images often exhibit intense artifacts associated with signal generated far from the isocenter, along the S/I axis (~20-30 cm). Due to its appearance in spin echo or gradient echo images, this is often referred to as "star artifact." Sagittal images (slice selection direction R/L=X) are typically acquired with frequency encoding along A/P (=Y) and phase encoding along S/I (=Z). In the slice selection direction, as the X-gradient becomes weaker with increasing distance from the isocenter along S/I, the excited slice effectively becomes thicker, such that more signal is generated. Signal from outside the nominal slice thickness is being added to the acquired signal, which is referred to as signal compression (along the X direction). Similarly, in the frequency encoding direction, as the Y-gradient becomes weaker far from the isocenter (along S/I), signal that originates far from Y=0 will be reconstructed as if it originated from closer to Y=0, resulting in additional signal compression (along the Y direction). In the phase encoding direction, the Z-gradient becomes nonlinear far from the isocenter (along Z), reaches a null-slope point, and then reverses its direction. Signal from points affected by the nonlinear behavior of the Z-gradient may experience incorrect spatial encoding and reconstructed as if it originated from closer to Z=0, resulting in signal compression along the Z direction. The poor gradient linearity/uniformity far from the isocenter along Z may also cause spoiler gradients to be less effective. Therefore, undesired signal excited by refocusing pulses may not be sufficiently dephased by such gradient pulses. In FSE images, the artifact may exhibit a ghosting pattern which is the result of k-space signal modulation due to multiple causes, such as eddy currents, $B_0$ instability (temporal field drift), receive signal instability, system vibrations, and signal $T_2$-decay, etc. With this ghosting, the artifact is often referred to as "annefact". As the star artifact and the annefact artifact both originate from the non-linearity of the gradient fields, the disclosure herein can address both the star artifact and the annefact artifact.

FIG. 10 shows a subroutine 1000 for generating an annefact intensity curve based on error maps during the full mode calibration scan. In particular, after removing MR signals in the distortion map generated from the linear gradient regions, the data may be projected onto the coil selection direction or the slice selection direction to obtain the annefact intensity curve. Each value of the annefact intensity curve represents the intensity of the artifact in MR signals received at a particular location in the coil selection direction.

At 1002, a 3D homogenous dataset is initialized in the full mode calibration region. As one example, the dimension (in pixels or cm) of the 3D homogenous dataset is set to be the same as the dimension of the calibration region. Each data point (or pixel) of the 3D homogenous dataset is set to be the same value (such as one).

In one embodiment, 3D gradwarp error maps in frequency, phase and slice directions are calculated based on the system gradient model. In one example, the 3D error maps includes the frequency gradwarp error map, the phase gradwarp error map, and the slice gradwarp error map. Each gradwarp error map is three dimensional, and each gradwarp error map corresponds to signal collapse in each of the frequency encoding direction, phase encoding direction, and the slice selection direction, respectively. The 3D error maps may be calculated based on the system gradient model and the region of the calibration scan. For example, the gradient model may be predetermined for example via imaging a phantom. The distortions may be calculated by inputting the location of the calibration scan to the gradient model. In another embodiment, the frequency, phase, and the slice gradwarp error maps may be pre-calibrated and stored in the memory of the MRI apparatus.

At 1004, reverse gradwarp is applied to the homogeneous dataset to obtain a 3D distortion map. The reverse gradwarp process simulates the signal collapse because of nonlinear gradient of the system. For example, the reverse gradwarp may include applying the frequency, phase, and the slice gradwarp error maps to the initialized homogeneous dataset to identify the signal collapse region.

At 1006, the overall 3D distortion map is generated by applying the frequency, phase, and slice distortion maps.

At 1008, an annefact intensity map is generated by applying a sphere mask to filter out nonvalid region. The center of the circular mask may be the gradient ISO center. The diameter of the circular mask may be determined by the gradient error map valid range. In one example, the nonvalid region may be the region outside of the bore. In another example, the nonvalid region may be the region that the gradient error map cannot be applied to. In another example, the gradient error map may be one or more of the gradwarp error maps. The data point outside of the circular mask is set to a minimal value (such as zero). Generating the annefact intensity map at 1008 may also include thresholding the 3D distortion map to remove the signals in the linear gradient region, because the annefact artifact is more likely to be caused by the nonlinearity region of the gradient which has high intensity in the 3D distortion map. The threshold may be determined based on the initialization value and the gradient types.

At 1010, a corrected annefact intensity map is obtained by applying the grawarp to the annefact intensity map. The gradwarp is applied to the 3D annefact intensity map to identify the source region to cause the signal piling up. Gradwarp is a process to remove the distortion introduced by the nonlinear gradient to obtain the true imaging object. By removing the distortion, the signal positions within the annefact intensity map correspond to the physical locations of the annefact source region. If signals are received in the annefact source region, annefact will be observed in the reconstructed images. By turning off the REGs in the annefact source region, the dynamic coil mode can reduce the annefact artifact. In one example, the gradwarp process may be applied to the annefact intensity map by applying a reverse of the frequency gradwarp error map, a reverse of the phase gradwarp error map, and a reverse of the slice gradwarp error map to the annefact intensity map.

At 1012, after applying the gradwarp, the corrected annefact intensity map is projected onto the coil selection direction to obtain the 1D annefact intensity curve. Each data point of the annefact intensity curve corresponds to the intensity of the annefact artifact at a corresponding location along the REG selection direction.

Figure 11:
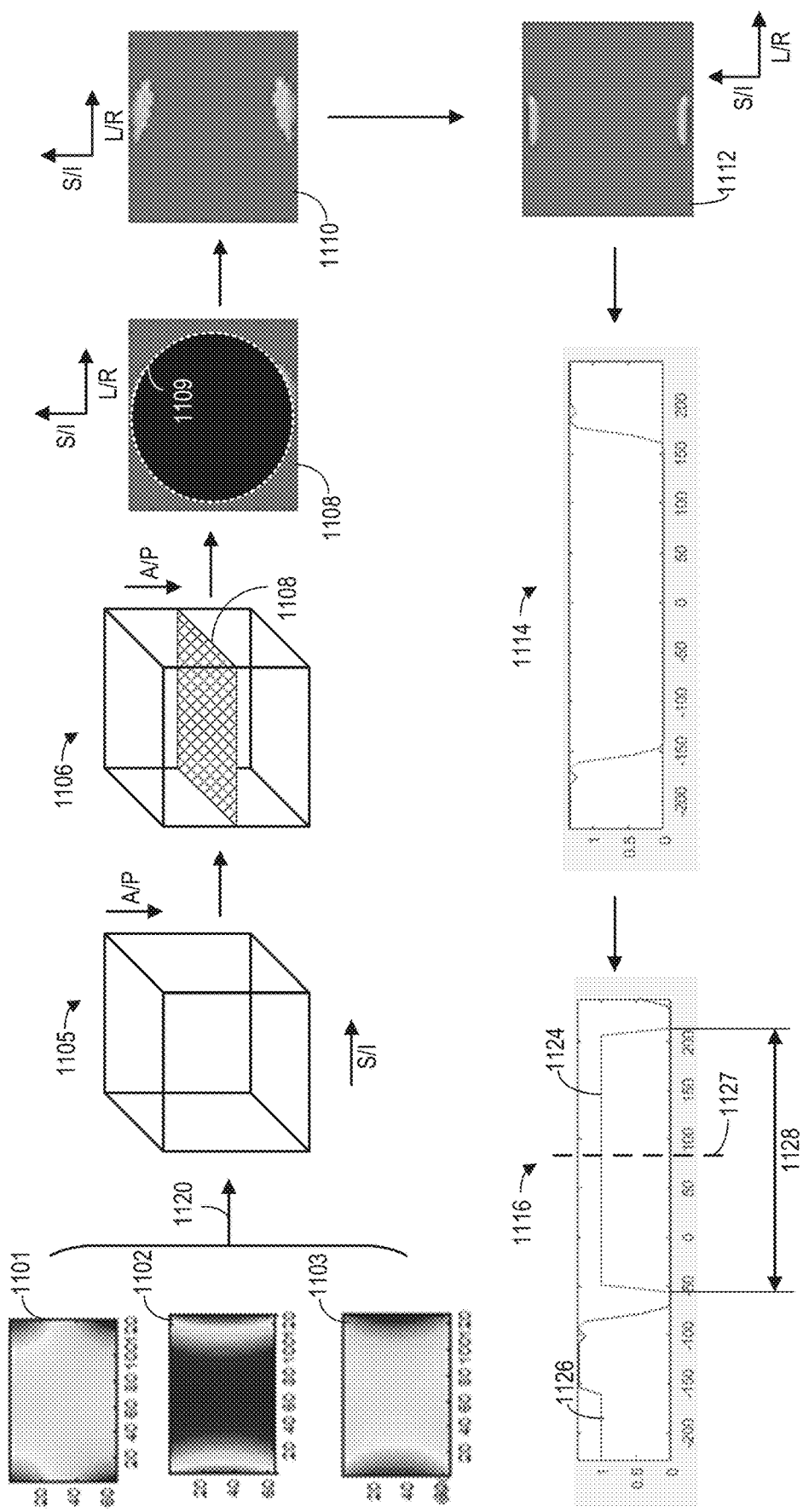
FIG. 11 is a set of images illustrating generation of the annefact intensity curve according to the subroutine of FIG. 10.

FIG. 11 shows images illustrating an example implementation of subroutine 1000 of FIG. 10. Graph 1101 shows a slice of the 3D frequency gradwarp error map in the axial plane, graph 1102 shows a slice of the 3D phase gradwarp error map in the axial plane, and graph 1103 shows a slice of the 3D slice gradwarp error map in the axial plane. The frequency, phase, and slide error maps are applied to (as indicated by arrow 1120) the homogenously initialized 3D dataset 1105 matching full mode calibration region. As an example, herein, the coil selection direction is the S/I direction.

Image 1106 shows the 3D distortion map after applying the grawarp error maps, and image 1108 shows a coronal plane of the 3D distortion map 1106. A circular mask 1109 is applied to the central region of the distortion map. The position and area of the circular mask 1109 may correspond to the valid gradient model region size of the imaging area (or bore). Data points outside of the circular mask may be set to a minimal valve (such as zero). Image 1110 is the coronal plane of a 3D annefact intensity map generated after applying the circular mask 1109 and thresholding to the 3D distortion map 1106.

A corrected annefact intensity map may be generated after applying the gradwarp process to the 3D annefact intensity map. Image 1112 shows a coronal plane of the corrected annefact intensity map gradwarp, which is corrected from image 1110 of the 3D annefact intensity map. In one example, a reverse of the frequency gradwarp error map 1101 and a reverse of the phase gradwarp error map 1102 are applied to the annefact intensity map 1110 to obtain volume, an example of coronal plane is 1112.

The corrected annefact intensity map 1112 is then projected onto the S/I direction to obtain the annefact intensity curve 1114. The x-axis of the annefact intensity curve 1114 is distance (such as in pixels or cm) along the S/I direction. The y-axis of the annefact intensity curve 1114 is the relative intensity of the annefact artifact. The center of the annefact intensity curve 1114 (zero in x-axis) corresponds to the center of the sphere mask 1109, which may be the ISO center of the MR scanner.

Image 1116 shows the annefact curve 1126 and an ROI profile 1124. ROI profile 1124 shows the extent of an operator-selected ROI in the S/I direction. The ROI profile is set to be a top hat shape with amplitude of 1. That is, the value of the ROI profile is one within the ROI, and the value of the ROI profile is zero outside of the ROI. The annefact intensity curve 1116 may be shifted from the annefact intensity curve 1114 based on the location of the ROI to align with the ISO center during imaging scan. For example, the center of the annefact intensity curve 1116 is the same as the center location 1127 of the ROI profile 1124. The center location 1127 is at the middle point of the extent 1128 of the ROI profile in the S/I direction. The extent 1128 is the non-zero portion of the ROI profile. After shifting, regions of the annefact intensity curve without any values are padded with a constant value (such as one).

FIG. 12 shows an example subroutine 1200 for determining the dynamic coil mode. The dynamic coil mode includes one or more REGs for imaging a specific ROI. In one example, the REGs in the dynamic coil mode are selected based on the REG sensitivity of each REG in the REG sensitivity map, the annefact intensity curve, the annefact sensitivity factor, and the ROI. In particular, REGs are selected based on the sensitivity of each REG to MR signals generated outside of the ROI, and the sensitivity of the respective REG to MR signals generated within the ROI.

At 1202, the first REG in the REG sensitivity map is selected. The REG sensitivity of the first REG may be extracted from the REG sensitivity map. For example, the REG sensitivity of the first REG is the first row of the REG sensitivity map 802 of FIG. 8A.

At 1204, the first sensitivity of the REG to the MR signals generated within the ROI is calculated based on the REG sensitivity and the ROI profile. For example, the first sensitivity $S_1$ is the dot product of the REG sensitivity and the ROI profile:

$$S_1 = REG \cdot ROI = \Sigma_{i=1}^{K} REG_i \times ROI_i, \qquad \text{Equation 1}$$

wherein REG is the REG sensitivity (such as REG sensitivity 1331 of FIG. 13) of the REG under evaluation, ROI is the ROI profile (such as ROI profile 1320 of FIG. 13), and i is the ith data point along the REG selection direction. If the ROI profile is 1 in the extent of [S, T] (as shown in ROI profile 1320 of FIG. 13) and zero elsewhere, the first sensitivity may also be expressed as $$S_1 = \Sigma_{i=s}^{T} REG_i, \qquad \text{Equation 2}$$

wherein S<T and S, T∈[1, N]. In other words, the first sensitivity is the sum of the REG sensitivity within the ROI.

At 1206, the second sensitivity of the REG to the MR signals generated in annefact source region is calculated. The second sensitivity $S_2$ may be the dot product of the REG sensitivity, the annefact intensity curve, and the annefact sensitivity factor in the annefact source region:

$$S_2 = aREG \cdot A = \Sigma_{i=1}^{K} aREG_{i} \times A_i, \qquad \text{Equation 3}$$

wherein a is the annefact sensitivity factor (such as annefact sensitivity factor 1340 of FIG. 13), and A is the annefact intensity curve (such as annefact intensity curve 1310 of FIG. 13). As shown in Equation 3, the second sensitivity is the sum of the product of the REG sensitivity, the annefact intensity curve, and the annefact sensitivity factor at each data point along the coil selection direction in the annefact source region.

At 1208, the sensitivity difference between the first sensitivity and the second sensitivity is calculated as $$\Delta S = S_1 - S_2,$$ Equation 4 wherein ΔS is the sensitivity difference. Increasing sensitivity difference corresponds to a greater contribution of data received via the REG to the MR signals generated within the ROI, while decreasing sensitivity difference corresponds to a greater contribution of data received via the REG to the annefact artifact.

At 1210, the sensitivity difference is compared with a threshold. If the sensitivity difference is higher than the threshold, the REG is included in the dynamic coil mode at 1212. Otherwise, if the sensitivity difference is not higher than the threshold, the REG is excluded from the dynamic coil mode. The threshold may be determined based on the desired image SNR and the tolerance to the artifact. In one example, the threshold is set to zero.

At 1214, subroutine 1200 checks whether the REG under evaluation is the last REG of the REG sensitivity map. If the answer is yes, subroutine 1200 exits. If the answer is no, subroutine 1200 selects the next REG in the REG sensitivity map at 1216, and calculates the sensitivity difference of the next REG.

In some examples, additional constraints may be applied to generate the dynamic coil mode. For example, after evaluating the REGs based on the sensitivity differences, the REGs that are included in the dynamic coil mode may be further evaluated to determine whether the identified REGs are compatible with each other. The identified REGs might be exclusive of each other. For example, if the first REG consists of all coil elements in the anterior coil array 210 and the second REG consists of coil elements in row 211, the first and second REGs are exclusive of each other because they both include coil elements in row 211. Therefore, in some embodiments, tiebreaker rules may be applied to select one REG from exclusive REGs. For example, if parallel imaging is used, a bigger REG (i.e., first REG) is preferred; while if reduction of phase wrap artifact is preferred, a smaller REG (i.e., second REG) is preferred. In some embodiments, multiple factors are considered in totality and the REG that strikes the best balance is selected from exclusive REGs.

FIG. 13 is a set of images illustrating an example implementation of the subroutine of FIG. 12 for determining the dynamic coil mode. In particular, the REGs are selected based on the sensitivity of each REG to the MR signals generated within ROI and the sensitivity of the REG to the MR signals generated in the annefact source regions. Example annefact intensity curve 1310, ROI profile 1320, REG sensitivities 1330 of four REGs 1331-1334, and the annefact sensitivity factor 1340 are shown in FIG. 13. The x-axes of the annefact intensity curve 1310, ROI profile 1320, REG sensitivities 1330, and the annefact sensitivity factor 1340 are distance along the S/I direction. The extent 1321 of the ROI profile 1320 is from S to T. The REG sensitivity of each REG is a Gaussian curve. The extents of the four REGs overlap. The first REG 1331 and the fourth REG 1334 each have an extent outside of the ROI.

Based on the Equations 1-4, the sensitivity differences of each of the four REGs may be calculated. The sensitivity differences are shown in graph 1350. The x-axis is the REG index, and the y-axis is the sensitivity differences. As a portion of the first REG 1331 and a portion of the fourth REG 1334 are outside of the ROI and in the annefact source region, the sensitivity differences of the first REG 1331 and the fourth REG 1334 are lower than the second REG 1332 and third REG 1333.

As explained above, the threshold for excluding REGs from the dynamic coil mode may be zero in one non-limiting example. In such an example, each REG shown in FIG. 13 would be included in the dynamic coil mode. However, if the annefact sensitivity factor were to be increased (e.g., to 5), the sensitivity difference of each REG would decrease, and one or more REG may be excluded from the dynamic coil mode. In another example, the sensitivity difference of REG partially overlapped with the ROI may decrease with increased amplitude of the annefact intensity curve. As a result, one ore more REGs that are partially overlapped with the ROI may be excluded from the dynamic coil mode. In yet another example, the annefact intensity curve may not be symmetric relative to its center position. As a result, even when the REG overlap region is the same for two REGs, each close to one of the boundaries of the ROI, only one of the two REGs may be included in the dynamic coil mode.

FIG. 14 shows multiple MRI images of the same FOV acquired with different dynamic coil modes. Each dynamic coil mode corresponds to a different annefact sensitivity factor.

The annefact intensity curve 1403 and the ROI profile 1404 are shown in graph 1402. The x-axis is the distance along the REG selection direction. The distance between dashed lines 1405 and 1406 is the extent of the ROI.

As shown in the REG sensitivity map 1410, five REGs overlap with the ROI profile 1404. When the annefact sensitivity factor is set to zero, the sensitivity differences of all five REGs are higher than the threshold, such as zero, thus all five REGs are used to image the FOV. The reconstructed image 1411 contains strong feather like annefact artifact, indicated by arrows in image 1411.

When the annefact sensitivity factor is set to 1, the sensitivity differences of the first and fifth REGs decrease to a level below the threshold. Therefore, the first and fifth REGs are excluded from the dynamic coil mode during the main scan. As indicated in image 1420, signals received from the second, third, and fourth REGs are used for reconstructing image 1421. Reconstructed image 1421 covers the same FOV as image 1411. The annefact artifact is significantly reduced.

When the annefact sensitivity factor is increased from 1 to 5, the sensitivity differences of the fourth REG also decreases to a level below the threshold. Therefore, the first, fourth, and fifth REGs are excluded from the dynamic coil mode during the main scan. The second and third REGs are included in the dynamic coil mode. As such, part of the ROI is not covered by any REGs. The insufficient coverage of the ROI by the dynamic coil mode may be displayed to the operator at 324 of FIG. 14. Responsive to the improper coverage, the operator may choose to adjust the RF coil position, or continue the main scan with the current dynamic coil mode. As indicated in image 1430, signals received from the second and third REGs are used for reconstructing image 1431. Reconstructed image 1431 covers the same FOV as image 1411. The annefact artifact is not visible in image 1431. However, due to the decrease in the number of REGs included in the dynamic coil mode, image 1431 has lower SNR comparing to images 1411 and 1421. The contrast of image 1431 is lower than images 1411 and 1421. Therefore, by adjusting the annefact sensitivity factor, the tradeoff between the intensity of the annefact artifact and the image SNR can be addressed.

FIG. 15 is an example visual representation of the dynamic coil mode displayed with image 1502 of the imaging subject acquired from localizer scan. The image 1502 shows the subject in the sagittal plane. Extent 1504 of a first REG and extent 1506 of a second REG are shown on left side of the image 1502. In one example, the first and second REGs are from the same coil array (e.g., anterior array), and are selected according the dynamic coil mode. The extent 1508 of a third REG is shown on the right side of the image 1502 relative to the subject. The third REG is from the posterior array, and is selected according to the dynamic coil mode. Lines 1310 in the posterior-anterior direction show position of the slices for the main scan. Overlapped area 1507 between extent 1504 and 1506 is displayed on top of the image 1502. For example, the overlapped area may be displayed by shading the area with a color. In one embodiment, if the extent of the overlapped area along the extent of the REG exceeding a predetermined threshold value, the overlapped area may be shaded with a second color indicating excessive overlap between the REGs in the dynamic coil mode. Excessive overlap between the REGs increases the number of coil elements for receiving the MR signals, which may lead to higher noise level. Responsive to excessive overlap, the operator may re-adjust the coil array position to reduce the overlapped area between REGs. In this way, signal to noise level of the received MR signals may be increased. Alternatively, the operator may command to proceed with the main scan with the current REG position. The REG extents 1504 and 1506 may also be displayed in the second color indicating error in the REG selection of the anterior coil array. If the extent of the overlapped area is less or equal to the threshold value, the overlapped area may be shaded with a first color indicating proper overlap between the REGs. As the extent 1508 fully covers the ROI, the extent 1508 is displayed in the first color indicating proper REG selection of the posterior coil array.

The technical effect of selecting the portions of the coil arrays (such as one or more REGs of the coil arrays) for scanning based on the sensitivity of each REG to MR signals generated outside the ROI is that REGs contributing to the annefact artifact may be excluded during the main scan. The technical effect of selecting the REGs based on the annefact sensitivity factor is that the image SNR and the annefact artifact intensity in the reconstructed image may be adjusted. The technical effect of generating the annefact intensity curve based on the data acquired from calibration scan is that the intensity of the annefact artifact in the reconstructed image may be estimated.

In one embodiment, a method for magnetic resonance imaging (MRI) with a radio frequency (RF) coil array comprising a plurality of coil elements includes grouping the plurality of coil elements into receive elements groups (REGs) according to REGs information; generating REG sensitivity maps; determining, for each REG, signal in a region of interest (ROI) and signal in an annefact source region based on the REG sensitivity maps; selecting one or more REGs based on the signal in the ROI and the signal in the annefact source region; and scanning the ROI with the coil elements in the one or more selected REGs being activated and the coil elements not in any selected REGs being deactivated. In a first example of the method, scanning the ROI with the one or more selected REGs being activated comprises scanning the ROI with the one or more selected REGs being activated during a higher resolution scan, and wherein generating REG sensitivity maps comprises generating REG sensitivity maps from coil element sensitivity maps for the plurality of coil elements generated from data acquired from a lower resolution calibration scan. In a second example of the method, which optionally includes the first example, determining, for each REG, signal in the annefact source region comprises: generating an annefact intensity curve based on a homogenous 3D dataset initialized from scan dimensions of the lower resolution calibration scan, the annefact intensity curve representing a location and a strength of nonlinearity of gradient fields of the MRI system; and determining the signal in the annefact source region based on the annefact intensity curve. A third example of the method optionally includes one or more of the first and second examples, and further includes wherein generating the annefact intensity curve comprises: applying a circular mask to the annefact sensitivity map; and obtaining the annefact intensity curve by projecting the masked annefact sensitivity map along the coil selection direction. A fourth example of the method optionally includes one or more of the first through third examples, and further includes, wherein the circular mask is applied by setting values of the annefact sensitivity map within the circular mask to zero. A fifth example of the method optionally includes one or more of the first through fourth examples, and further includes, wherein determining the signal in the annefact source region based on the annefact intensity curve comprises determining the signal in the annefact source region for each REG based on a product of the annefact intensity curve and a REG sensitivity of each REG from the REG sensitivity maps. A sixth example of the method optionally includes one or more of the first through fifth examples, and further includes, determining an annefact sensitivity factor based on an imaging protocol prescribed by an operator, and wherein determining the signal in the annefact source region for each REG based on a product of the annefact intensity curve and a REG sensitivity of each REG from the REG sensitivity maps includes determining the signal in the annefact source region for each REG based on a product of the annefact intensity curve, a REG sensitivity of each REG from the REG sensitivity maps, and the annefact sensitivity factor. A seventh example of the method optionally includes one or more of the first through sixth examples, and further includes, wherein determining, for each REG, signal in the ROI comprises summing REG sensitivity values of the REG sensitivity maps within the ROI for each REG, and further comprising: calculating a sensitivity difference between the signal within the ROI and the signal outside in the annefact source region; and wherein selecting one or more REGs based on the signal in the ROI and the signal in the annefact source region includes selecting the one or more REGs based on the sensitivity difference. A eighth example of the method optionally includes one or more of the first through seventh examples, and further includes, wherein selecting the one or more REGs based on the sensitivity difference includes selecting one or more REGs that have a sensitivity difference higher than a threshold. A ninth example of the method optionally includes one or more of the first through eighth examples, and further includes, wherein the signal within the ROI for each REG is determined by multiplying a REG sensitivity for each REG with a ROI profile.

In another embodiment, a method for magnetic resonance imaging (MRI) with a radio frequency (RF) coil array comprising a plurality of coil elements includes performing a lower resolution calibration scan of a field of view (FOV) with the plurality of coil elements, the plurality of coil elements grouped into a plurality of receive element groups (REGs); determining an annefact intensity curve based on dimensions of the calibration scan, the annefact intensity curve representing a location and a strength of nonlinearity of gradient fields of the MRI system; determining a first sensitivity of one or more REGs to magnetic resonance (MR) signals generated inside a region of interest (ROI); determining a second sensitivity of one or more REGs to MR signals generated inside an annefact source region based on the annefact intensity curve; selecting a collection of REGs based on the first sensitivity and the second sensitivity; and reconstructing an image covering the ROI based on data obtained from the selected collection of REGs during a higher resolution main scan. In a first example of the method, the method further includes determining a REG sensitivity map for each REG of the one or more REGs based on data acquired during the calibration scan, each REG sensitivity map comprising a sensitivity of a respective REG along a coil selection direction; and wherein determining a second sensitivity of one or more REGs to MR signals generated inside an annefact source region based on the annefact intensity curve includes determining a second sensitivity of one or more REGs based on a product of the annefact intensity curve and the REG sensitivity map of the respective REG. A second example of the method optionally includes the first example and further includes, receiving a second, different, ROI; shifting the annefact intensity curve based on a position of the second ROI; selecting a second collection of REGs based on the shifted annefact intensity curve and the new ROI; and reconstructing a second image covering the second ROI with data obtained from the second collection of REGs during a second higher resolution main scan. A third example of the method optionally includes one or more of the first and second examples, and further includes receiving a second, different, ROI; determining a new annefact intensity curve; and selecting a second collection of REGs based on the new annefact intensity curve and the second ROI; and reconstructing a second image of the second ROI with data obtained from the second collection of REGs during a second higher resolution main scan. A fourth example of the method optionally includes one or more of the first through third examples, and further includes, determining an annefact sensitivity factor based on a read out direction of the MR signals and a pulse sequence of a second higher resolution main scan, and wherein determining a second sensitivity of one or more REGs based on a product of the annefact intensity curve and the REG sensitivity map of the respective REG includes determining the second sensitivity based on a product of the annefact intensity curve, the REG sensitivity of the respective REG, and the annefact sensitivity factor. A fifth example of the method optionally includes one or more of the first through fourth examples, and further includes, wherein selecting a collection of REGs based on the first sensitivity and the second sensitivity includes selecting one or more REGs having a sensitivity difference higher than a threshold level, each sensitivity difference comprising a difference between a respective first sensitivity and a respective second sensitivity.

In yet another embodiment, a magnetic resonance imaging (MRI) apparatus, comprises: a controller unit; one or more radiofrequency (RF) coil arrays, each RF coil array including a plurality of coil elements, the coil elements grouped into a plurality of receive element groups (REGs); a display unit; and a memory storing executable instructions that when executed cause the controller unit to: select one or more receive element groups (REGs) from a plurality of REGs based on a sensitivity of a REG to magnetic resonance (MR) signals in annefact source region, the REG comprising a subset of the plurality of the coil elements; and reconstruct an image covering the ROI based on data obtained from the selected one or more REGs. In a first example of the apparatus, the apparatus further includes instructions that when executed cause the controller unit to: during a lower resolution calibration scan, obtain a plurality of first datasets, each first dataset acquired from a respective coil element of the one or more RF coil arrays that overlaps with a field of view (FOV); determine a coil element sensitivity of each coil element of the one or more RF coil arrays that overlaps with the FOV by projecting each first dataset along a coil selection direction; determine a REG sensitivity of the REG based on coil element sensitivities of each coil element corresponding to the REG, the REG sensitivity comprising a sensitivity of the REG along the coil selection direction; determine an annefact intensity curve based on a homogenous 3D dataset initialized based on dimensions of the calibration scan, the annefact intensity curve representing a strength and location of an annefact artifact; and determine the sensitivity of the REG to the MR signals in the annefact source region based on a product of the REG sensitivity and the annefact intensity curve. A second example of the apparatus optionally includes the first example and further includes, instructions that when executed cause the controller unit to generate the annefact intensity curve by applying reverse gradient error maps to the homogenous 3D dataset. A third example of the apparatus optionally includes one or more of the first and second examples, and further includes wherein selecting one or more REGs from the plurality of REGs based on the sensitivity of the REG to MR signals in the annefact source region includes selecting one or more REGs from the plurality of REGs based further on a product of the REG sensitivity and a ROI profile.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI) with a radio frequency (RF) coil array comprising a plurality of coil elements, the method comprising:

grouping the plurality of coil elements into receive elements groups (REGs) according to REGs information;

generating REG sensitivity maps including a respective REG sensitivity map for each REG, the REG sensitivity maps generated based on a plurality of 3D datasets obtained from the plurality of coil elements during a full mode calibration scan of a patient;

determining, for each REG, signal in a region of interest (ROI) of the patient and signal in an annefact source region based on the REG sensitivity maps;

selecting one or more REGs based on the signal in the ROI and the signal in the annefact source region;

scanning the ROI with the coil elements in the one or more selected REGs being activated and the coil elements not in any selected REGs being deactivated; and reconstructing an image covering the ROI based on data obtained from the coil elements in the one or more selected REGs during the scanning of the ROI.

2. The method of claim 1, wherein scanning the ROI with the one or more selected REGs being activated comprises scanning the ROI with the one or more selected REGs being activated during a higher resolution scan, and wherein generating REG sensitivity maps comprises generating REG sensitivity maps from coil element sensitivity maps for the plurality of coil elements generated from data acquired from a lower resolution calibration scan.

3. The method of claim 2, wherein determining, for each REG, signal in the annefact source region comprises:
generating an annefact intensity curve based on a homogenous 3D dataset initialized from scan dimensions of the lower resolution calibration scan, the annefact intensity curve representing a location and a strength of nonlinearity of gradient fields of the MRI system; and
determining the signal in the annefact source region based on the annefact intensity curve.

4. The method of claim 3, wherein generating the annefact intensity curve comprises applying a circular mask to the annefact sensitivity map.

5. The method of claim 4, further comprising obtaining the annefact intensity curve by projecting the masked annefact sensitivity map along the coil selection direction.

6. The method of claim 3, wherein determining the signal in the annefact source region based on the annefact intensity curve comprises determining the signal in the annefact source region for each REG based on a product of the annefact intensity curve and a REG sensitivity of each REG from the REG sensitivity maps.

7. The method of claim 6, further comprising determining an annefact sensitivity factor based on an imaging protocol prescribed by an operator, and wherein determining the signal in the annefact source region for each REG based on a product of the annefact intensity curve and a REG sensitivity of each REG from the REG sensitivity maps includes determining the signal in the annefact source region for each REG based on a product of the annefact intensity curve, a REG sensitivity of each REG from the REG sensitivity maps, and the annefact sensitivity factor.

8. The method of claim 1, wherein determining, for each REG, signal in the ROI comprises summing REG sensitivity values of the REG sensitivity maps within the ROI for each REG, and further comprising:
calculating a sensitivity difference between the signal within the ROI and the signal outside in the annefact source region; and
wherein selecting one or more REGs based on the signal in the ROI and the signal in the annefact source region includes selecting the one or more REGs based on the sensitivity difference.

9. The method of claim 8, wherein selecting the one or more REGs based on the sensitivity difference includes selecting one or more REGs that have a sensitivity difference higher than a threshold.

10. The method of claim 8, wherein the signal within the ROI for each REG is determined by multiplying a REG sensitivity for each REG with a ROI profile.

11. A method for magnetic resonance imaging (MRI) with a receive radio frequency (RF) coil array, the RF coil array comprising a plurality of coil elements, the method comprising:
performing a lower resolution calibration scan of a field of view (FOV) including a patient with the plurality of coil elements, the plurality of coil elements grouped into a plurality of receive element groups (REGs);
determining an annefact intensity curve based on dimensions of the lower resolution calibration scan, the annefact intensity curve representing a location and a strength of nonlinearity of gradient fields of the MRI system;
determining a first sensitivity of one or more REGs to magnetic resonance (MR) signals generated inside a region of interest (ROI) of the patient based on a plurality of 3D datasets obtained from the lower resolution calibration scan and an ROI profile;
determining a second sensitivity of one or more REGs to MR signals generated inside an annefact source region based on the plurality of 3D datasets obtained from the lower resolution calibration scan and the annefact intensity curve;
selecting a collection of REGs based on the first sensitivity and the second sensitivity; and
reconstructing an image covering the ROI based on data obtained from the selected collection of REGs during a higher resolution main scan of the patient.

12. The method of claim 11, further comprising:
determining a REG sensitivity map for each REG of the one or more REGs based on data acquired during the calibration scan, each REG sensitivity map comprising a sensitivity of a respective REG along a coil selection direction; and
wherein determining a second sensitivity of one or more REGs to MR signals generated inside an annefact source region based on the annefact intensity curve includes determining a second sensitivity of one or more REGs based on a product of the annefact intensity curve and the REG sensitivity map of the respective REG.

13. The method of claim 12, further comprising:
receiving a second, different, ROI;
shifting the annefact intensity curve based on a position of the second ROI;
selecting a second collection of REGs based on the shifted annefact intensity curve and the new ROI; and
reconstructing a second image covering the second ROI with data obtained from the second collection of REGs during a second higher resolution main scan.

14. The method of claim 12, further comprising:
receiving a second, different, ROI;
determining a new annefact intensity curve; and
selecting a second collection of REGs based on the new annefact intensity curve and the second ROI; and
reconstructing a second image of the second ROI with data obtained from the second collection of REGs during a second higher resolution main scan.

15. The method of claim 12, further comprising determining an annefact sensitivity factor based on a read out direction of the MR signals and a pulse sequence of a second higher resolution main scan, and wherein determining a second sensitivity of one or more REGs based on a product of the annefact intensity curve and the REG sensitivity map of the respective REG includes determining the second sensitivity based on a product of the annefact intensity curve, the REG sensitivity of the respective REG, and the annefact sensitivity factor.

16. The method of claim 11, wherein selecting a collection of REGs based on the first sensitivity and the second sensitivity includes selecting one or more REGs having a sensitivity difference higher than a threshold level, each sensitivity difference comprising a difference between a respective first sensitivity and a respective second sensitivity.

17. A magnetic resonance imaging (MRI) apparatus, comprising:
    a controller unit;
    one or more radiofrequency (RF) coil arrays, each RF coil array including a plurality of coil elements, the coil elements grouped into a plurality of receive element groups (REGs);
    a display unit; and
    a memory storing executable instructions that when executed cause the controller unit to:
        select one or more receive element groups (REGs) from a plurality of REGs based on a sensitivity of a REG to magnetic resonance (MR) signals in an annefact source region, the REG comprising a subset of the plurality of the coil elements; and
        reconstruct an image covering a region of interest (ROI) based on data obtained from the selected one or more REGs and not from any coil elements that are not in the selected one or more REGs.

18. The MRI apparatus of claim 17, further comprising instructions that when executed cause the controller unit to:
    during a lower resolution calibration scan, obtain a plurality of first datasets, each first dataset acquired from a respective coil element of the one or more RF coil arrays that overlaps with a field of view (FOV;
    determine a coil element sensitivity of each coil element of the one or more RF coil arrays that overlaps with the FOV by projecting each first dataset along a coil selection direction;
    determine a REG sensitivity of the REG based on coil element sensitivities of each coil element corresponding to the REG, the REG sensitivity comprising a sensitivity of the REG along the coil selection direction;
    determine an annefact intensity curve based on a homogenous 3D dataset initialized based on dimensions of the calibration scan, the annefact intensity curve representing a strength and location of an annefact artifact; and
    determine the sensitivity of the REG to the MR signals in the annefact source region based on a product of the REG sensitivity and the annefact intensity curve.

19. The MRI apparatus of claim 18, further comprising instructions that when executed cause the controller unit to generate the annefact intensity curve by applying reverse gradient error maps to the homogenous 3D dataset.

20. The MRI apparatus of claim 18, wherein selecting one or more REGs from the plurality of REGs based on the sensitivity of the REG to MR signals in the annefact source region includes selecting one or more REGs from the plurality of REGs based further on a product of the REG sensitivity and a ROI profile.

* * * * *